(12) United States Patent
Mizutani et al.

(10) Patent No.: US 12,012,658 B2
(45) Date of Patent: Jun. 18, 2024

(54) COMPOSITION, KIT, AND METHOD FOR TREATING SUBSTRATE

(71) Applicant: FUJIFILM Corporation, Tokyo (JP)

(72) Inventors: Atsushi Mizutani, Shizuoka (JP); Tetsuya Kamimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 17/565,419

(22) Filed: Dec. 29, 2021

(65) Prior Publication Data
US 2022/0119960 A1    Apr. 21, 2022

Related U.S. Application Data

(63) Continuation of application No. PCT/JP2020/023734, filed on Jun. 17, 2020.

(30) Foreign Application Priority Data

Jul. 5, 2019  (JP) ................................ 2019-125802
Jun. 10, 2020  (JP) ................................ 2020-100897

(51) Int. Cl.
*C23F 1/16*  (2006.01)
*H01L 21/3213*  (2006.01)

(52) U.S. Cl.
CPC .......... *C23F 1/16* (2013.01); *H01L 21/32134* (2013.01)

(58) Field of Classification Search
CPC ...... C23F 1/16; C23F 1/30; C23F 1/40; C23F 1/44; H01L 21/32134; H01L 21/02057; H01L 21/768; H01L 21/304; H01L 21/308; H01L 21/3213; C11D 3/04; C11D 3/26;

(Continued)

(56) References Cited

U.S. PATENT DOCUMENTS 6,177,331 B1    1/2001    Koga
6,261,953 B1    7/2001    Uozumi
6,475,909 B2    11/2002    Uozumi (Continued)

FOREIGN PATENT DOCUMENTS

JP    H10335444    12/1998
JP    2000269178    9/2000

(Continued)

OTHER PUBLICATIONS

"Office Action of Japan Counterpart Application" with English translation thereof, dated Jul. 19, 2022, p. 1-p. 12.

(Continued)

*Primary Examiner* — Duy Vu N Deo
(74) *Attorney, Agent, or Firm* — JCIPRNET

(57) ABSTRACT

An object of the present invention is to provide a composition that exhibits excellent dissolving ability and etching selectivity (particularly, etching selectivity for a Ru-containing substance and other metal-containing substances) to metal-containing substances (particularly, a Ru-containing substance), a kit for preparing the composition, and a method for treating a substrate by using the composition.

The composition according to an embodiment of the present invention is a composition for removing metal-containing substances, and contains one or more periodic acid compounds selected from the group consisting of a periodic acid and a salt thereof, an azole compound, and an alkali compound.

21 Claims, 2 Drawing Sheets

(58) Field of Classification Search
CPC .... C11D 3/28; C11D 3/39; C11D 3/43; C11D 7/04; C11D 7/32; C11D 7/50
USPC ......... 438/745–754; 216/108; 252/79.1–79.4
See application file for complete search history.

(56) References Cited

U.S. PATENT DOCUMENTS

| | | | |
|---|---|---|---|
| 6,683,007 | B1 | 1/2004 | Yamasaki et al. |
| 6,725,119 | B1 | 4/2004 | Wake |
| 6,818,556 | B2 | 11/2004 | Uozumi |
| 6,964,724 | B2 | 11/2005 | Yamasaki et al. |
| 7,183,203 | B2 | 2/2007 | Uozumi |
| 7,862,658 | B2 | 1/2011 | Yamasaki et al. |
| 8,420,549 | B2 | 4/2013 | Yamasaki et al. |
| 9,556,363 | B2 | 1/2017 | Fu et al. |
| 10,626,356 | B2 | 4/2020 | Kamimura et al. |
| 2008/0148649 | A1* | 6/2008 | Liu .................... H01L 21/3212 451/36 |
| 2012/0256122 | A1 | 10/2012 | Sato et al. |
| 2015/0267112 | A1* | 9/2015 | Dory ................ H01L 21/32134 252/79.1 |
| 2016/0032186 | A1 | 2/2016 | Chen et al. |
| 2016/0130500 | A1 | 5/2016 | Chen et al. |
| 2018/0002571 | A1* | 1/2018 | Stender ............... H01L 21/3212 |
| 2019/0106596 | A1 | 4/2019 | Mishra |
| 2019/0136161 | A1* | 5/2019 | Kamimura ............... C11D 7/26 |
| 2019/0247975 | A1 | 8/2019 | Omori et al. |
| 2019/0359857 | A1 | 11/2019 | Mishra |
| 2019/0359858 | A1 | 11/2019 | Mishra |
| 2021/0348029 | A1 | 11/2021 | Mishra |
| 2022/0169892 | A1 | 6/2022 | Mishra |

FOREIGN PATENT DOCUMENTS

| | | |
|---|---|---|
| JP | 2001102347 | 4/2001 |
| JP | 2001127019 | 5/2001 |
| JP | 2001210630 | 8/2001 |
| JP | 2002231676 | 8/2002 |
| JP | 2003347299 | 12/2003 |
| JP | 2006060218 | 3/2006 |
| JP | 2008172222 | 7/2008 |
| JP | 2009081247 | 4/2009 |
| JP | 2012504871 | 2/2012 |
| JP | 2015126194 | 7/2015 |
| JP | 2016510175 | 4/2016 |
| JP | 2016527707 | 9/2016 |
| JP | 2017525796 | 9/2017 |
| JP | 2019071413 | 5/2019 |
| KR | 1020080058242 | 6/2008 |
| TW | 201144484 | 12/2011 |
| TW | 201504397 | 2/2015 |
| WO | 2010039936 | 4/2010 |
| WO | 2011074601 | 6/2011 |
| WO | 2016140246 | 9/2016 |
| WO | 2018012468 | 1/2018 |
| WO | 2018021038 | 2/2018 |

OTHER PUBLICATIONS

"Decision of Refusal of Japan Counterpart Application", dated Feb. 14, 2023, with English translation thereof, p. 1- p. 3.

"Decision of Dismissal of Amendment of Japan Counterpart Application", dated Feb. 14, 2023, with English translation thereof, p. 1-p. 5.

"Office Action of Japan Counterpart Application" with English translation thereof, dated Nov. 8, 2022, p. 1-p. 13.

"International Search Report (Form PCT/ISA/210) of PCT/JP2020/023734," dated Jul. 14, 2020, with English translation thereof, pp. 1-7.

"Written Opinion of the International Searching Authority (Form PCT/ISA/237)" of PCT/JP2020/023734, dated Jul. 14, 2020, with English translation thereof, pp. 1-11.

"Office Action of Japan Counterpart Application", issued on Mar. 5, 2024, with English translation thereof, pp. 1-11.

"Office Action of Taiwan Counterpart Application", issued on Nov. 13, 2023, with English translation thereof, p. 1-p. 12.

"Office Action of Korea Counterpart Application No. 10-2022-7000002", issued on Apr. 15, 2024, with English translation thereof, p. 1-p. 30.

* cited by examiner

COMPOSITION, KIT, AND METHOD FOR TREATING SUBSTRATE

CROSS-REFERENCE TO RELATED APPLICATIONS

This application is a Continuation of PCT International Application No. PCT/JP2020/023734 filed on Jun. 17, 2020, which claims priority under 35 U.S.C. § 119(a) to Japanese Patent Application No. 2019-125802 filed on Jul. 5, 2019 and Japanese Patent Application No. 2020-100897 filed on Jun. 10, 2020. Each of the above applications is hereby expressly incorporated by reference, in its entirety, into the present application.

BACKGROUND OF THE INVENTION

1. Field of the Invention

The present invention relates to a composition, a kit, and a method for treating a substrate.

2. Description of the Related Art

As the miniaturization of semiconductor products progresses, there is an increasing demand for performing a step of removing unnecessary metal-containing substances on a substrate in a semiconductor product manufacturing process with high efficiency and high accuracy.

JP2009-081247A describes "a ruthenium film etching method as a method for patterning a ruthenium film formed on an upper surface of a substrate by using a mask consisting of copper, the method including a step (a) of supplying BTA as an anticorrosive for Cu to an upper surface of a substrate while supplying an aqueous solution of orthoperiodic acid to a lower surface so that a ruthenium film on the lower surface is removed, a step (b) of supplying BTA as an anticorrosive for Cu to the upper surface of the substrate while supplying an aqueous solution of orthoperiodic acid to an outer peripheral portion of the substrate after the step (a) so that a ruthenium film on the outer peripheral portion is removed, a step (c) of supplying pure water to the upper and lower surfaces of the substrate after the step (b) so that the aqueous solution of orthoperiodic acid is removed, and a step (d) of rotating the substrate after the step (c) so that the substrate dries.

SUMMARY OF THE INVENTION

In recent years, a composition that is used as an etchant for removing unnecessary metal-containing substances on a substrate has been required to exhibit a higher dissolving ability (etching performance) to the metal-containing substances. Particularly, it has been required that excellent etching performance is exhibited to an object to be treated having a ruthenium (Ru)-containing substance.

Furthermore, it has been increasingly required that in a step of removing unnecessary metal-containing substances on a substrate, high etching performance is exhibited to the target metal-containing substance while lower etching performance is exhibited to a metal-containing layer (such as a metal wire or a barrier metal layer) different from the target metal-containing substance. That is, the improvement of etching selectivity has been increasingly required.

An object of the present invention is to provide a composition that exhibits excellent dissolving ability and etching selectivity (particularly, etching selectivity for a Ru-containing substance and other metal-containing substances) to metal-containing substances (particularly, a Ru-containing substance).

Another object of the present invention is to provide a kit for preparing the composition and a method for treating a substrate by using the composition.

In order to achieve the above object, the inventors of the present invention carried out intensive studies. As a result, the inventors have found that the objects can be achieved by the following constitution.

[1]
A composition for removing metal-containing substances, containing one or more periodic acid compounds selected from the group consisting of a periodic acid and a salt thereof, an azole compound, and an alkali compound.

[2]
The composition described in [1], in which the metal-containing substances include a ruthenium-containing substance.

[3]
The composition described in [1] or [2], in which a ratio of a content of the periodic acid compounds to a content of the azole compound is 10 to 300 as a mass ratio.

[4]
The composition described in any one of [1] to [3], in which a ratio of a content of the periodic acid compounds to a content of the alkali compound is 0.5 to 2.0 as a mass ratio.

[5]
The composition described in any one of [1] to [4], further containing a water-soluble organic solvent.

[6]
The composition described in [5], in which the water-soluble organic solvent includes alkylene glycol dialkyl ether.

[7]
The composition described in [5] or [6], in which a ratio of a content of the water-soluble organic solvent to a content of the azole compound is 10 to 2,000 as a mass ratio.

[8]
The composition described in any one of [1] to [7], in which the azole compound includes at least one compound selected from the group consisting of a triazole compound, a pyrazole compound, and an imidazole compound.

[9]
The composition described in any one of [1] to [8], in which the alkali compound includes at least one compound selected from the group consisting of quaternary ammonium hydroxide, aminoalcohol, ammonia, and potassium hydroxide.

[10]
The composition described in any one of [1] to [9], further containing a surfactant.

[11]
The composition described in any one of [1] to [10], further containing an organic acid.

[12]
The composition described in [11], in which the organic acid includes at least one acid selected from the group consisting of a carboxylic acid and a phosphonic acid.

[13]
The composition described in [11] or [12], in which the organic acid includes at least one carboxylic acid and at least one phosphonic acid.

[14]
The composition described in any one of [1] to [13], which has a pH of 7.0 to 14.0.

[15]

A kit for preparing a composition used for removing metal-containing substances on a substrate, the kit including a first liquid that contains one or more periodic acid compounds selected from the group consisting of a periodic acid and a salt thereof and an alkali compound and a second liquid that contains an azole compound.

[16]

A method for treating a substrate, including a step A of removing metal-containing substances on a substrate by using the composition described in any one of [1] to [14].

[17]

The method for treating a substrate described in [16], in which the metal-containing substances include a ruthenium-containing substance.

[18]

The method for treating a substrate described in [16] or [17], in which there are two or more kinds of metal-containing substances on the substrate subjected to the step A.

[19]

The method for treating a substrate described in [18], in which the two or more kinds of metal-containing substances include at least a ruthenium-containing substance and a copper-containing substance or a cobalt-containing substance.

[20]

The method for treating a substrate described in [16], in which the metal-containing substances include a metal oxide in the form of particles.

[21]

The method for treating a substrate described in any one of [16] to [20], in which the step A is a step A1 of performing a recess etching treatment on metal-containing wiring line disposed on a substrate by using the composition, a step A2 of removing a metal-containing film at an outer edge portion of a substrate, on which the metal-containing film is disposed, by using the composition, a step A3 of removing metal-containing substances attached to a back surface of a substrate, on which a metal-containing film is disposed, by using the composition, a step A4 of removing metal-containing substances on a substrate, which has undergone dry etching, by using the composition, or a step A5 of removing metal-containing substances on a substrate, which has undergone a chemical mechanical polishing treatment, by using the composition.

[22]

The method for treating a substrate described in [21], in which the step A is the step A1, there are two or more kinds of metal-containing substances on the substrate subjected to the step A1, and a step A1a of removing at least one metal-containing substance among the two or more kinds of metal-containing substances and a step A1b of removing a metal-containing substance different from the metal-containing substance removed by the step A1a are performed as the step A1.

[23]

The method for treating a substrate described in [21] or [22] in which the step A is the step A1, the method further including a step B of treating the substrate obtained by the step A1 by using a solution selected from the group consisting of a mixed solution of hydrofluoric acid and hydrogen peroxide water, a mixed solution of sulfuric acid and hydrogen peroxide water, a mixed solution of aqueous ammonia and hydrogen peroxide water, and a mixed solution of hydrochloric acid and hydrogen peroxide water, before or after the step A1.

According to the present invention, it is possible to provide a composition that exhibits excellent dissolving ability and etching selectivity to metal-containing substances.

Furthermore, according to the present invention, it is possible to provide a kit for preparing the composition and a method for treating a substrate by using the composition.

DESCRIPTION OF THE PREFERRED EMBODIMENTS

Figure 1:
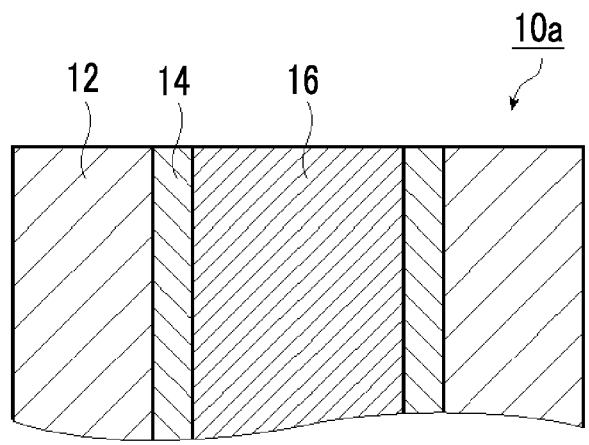
FIG. 1 is a schematic cross-sectional top view showing an example of an object to be treated used in a step A1.

Hereinafter, the present invention will be specifically described.

The following constituents will be described based on typical embodiments of the present invention in some cases, but the present invention is not limited to the embodiments.

In the present specification, in a case where there is no description regarding whether a group (atomic group) is substituent or unsubstituted, as long as the effects of the present invention are not reduced, the group includes both the group having no substituent and the group having a substituent. For example, "alkyl group" includes not only an alkyl group having no substituent (unsubstituted alkyl group) but also an alkyl group having a substituent (substituted alkyl group). The same is true of each compound.

In the present specification, unless otherwise specified, "exposure" includes not only the exposure using a mercury lamp, far ultraviolet rays represented by an excimer laser, X-rays, and Extreme Ultraviolet (EUV) light, but also lithography by particle beams such as electron beams and ion beams.

In the present specification, a range of numerical values described using "to" means a range including numerical values described before and after "to" as a lower limit and an upper limit.

In the present specification, a dry etching residue is a by-product generated as a result of performing dry etching (for example, plasma etching). For example, the dry etching residue refers to an organic residue derived from a photoresist, a Si-containing residue, a metal-containing residue, and the like.

[Composition]

The composition according to an embodiment of the present invention (hereinafter, also called "the present composition") is a composition containing one or more periodic acid compounds selected from the group consisting of a periodic acid and a salt thereof, an azole compound, and an alkali compound.

It is unclear through what mechanism the objects of the present invention are achieved by the use of the present composition. The inventors of the present invention assume that because the composition contains a periodic acid compound, excellent solubility of metal-containing substances may be achieved. Furthermore, the inventors assume that because the composition contains an alkali compound, the solubility of the metal-containing layer included in the substrate may be suppressed, etching selectivity may be improved, and thus the objects of the present invention may be achieved.

<Periodic Acid Compound>

The composition according to the embodiment of the present invention contains a periodic acid compound.

In the present specification, "periodic acid compound" is a generic term for compounds selected from the group consisting of a periodic acid and a salt thereof.

The periodic acid compound is not particularly limited. In view of excellent solubility of transition metal-containing substances represented by ruthenium, one or more of compounds selected from the group consisting of orthoperiodic acid ($H_5IO_6$), a salt of orthoperiodic acid, metaperiodic acid ($HIO_4$), and a salt of metaperiodic acid are preferable, and orthoperiodic acid or metaperiodic acid is more preferable. Among these, orthoperiodic acid is even more preferable because it does not contain an alkali metal such as sodium (Na) and the composition thereof is stable.

One kind of periodic acid compound may be used alone, or two or more kinds of periodic acid compounds may be used in combination.

In view of higher dissolving ability for metal-containing substances, the content of the periodic acid compound (total content in a case where the composition contains a plurality of periodic acid compounds) with respect to the total mass of the composition is preferably 0.1% by mass or more, more preferably 0.5% by mass or more, and even more preferably 2.0% by mass or more.

Furthermore, in view of higher etching selectivity, the content of the periodic acid compound with respect to the total mass of the composition is preferably 40.0% by mass or less, more preferably 30.0% by mass or less, even more preferably 20.0% by mass or less, and particularly preferably 10.0% by mass or less.

<Azole Compound>

The composition according to the embodiment of the present invention contains an azole compound.

The azole compound is a compound having at least one nitrogen atom and a 5-membered aromatic heterocycle.

The number of nitrogen atoms contained in the 5-membered heterocycle of the azole compound is not particularly limited, and is preferably 1 to 4 and more preferably 2 to 4.

The azole compound may have a substituent on the 5-membered heterocycle. Examples of such a substituent include a hydroxyl group, a carboxy group, a mercapto group, an amino group, and a substituted or unsubstituted hydrocarbon group. Furthermore, in a case where two substituents are adjacent to each other on the 5-membered heterocycle, the two substituents may be bonded to each other to form a ring.

Examples of the hydrocarbon group that the 5-membered heterocycle has as a substituent include an alkyl group (preferably having 1 to 12 carbon atoms and more preferably 1 to 6 carbon atoms) and an alkenyl group (preferably having 2 to 12 carbon atoms more preferably having 2 to 6 carbon atoms), an alkynyl group (preferably having 2 to 12 carbon atoms and more preferably having 2 to 6 carbon atoms), an aryl group (preferably having 6 to 18 carbon atoms and more preferably having 6 to 10 carbon atoms), and an aralkyl group (preferably having 7 to 23 carbon atoms and more preferably having 7 to 11 carbon atoms).

Examples of substituents that the aforementioned hydrocarbon groups have include a hydroxyl group, a carboxy group, and —$N(R_a)(R_b)$. $R_a$ and $R_b$ each independently represent a hydrogen atom, an alkyl group (preferably having 1 to 6 carbon atoms and more preferably having 1 to 4 carbon atoms), or a hydroxyalkyl group (preferably having 1 to 6 carbon atoms and more preferably having 1 to 4 carbon atoms).

The ring formed by the bonding of two adjacent substituents on the 5-membered heterocycle is not particularly limited, and is preferably an aromatic ring (which may be any of a monocyclic or polycyclic ring) and more preferably a benzene ring. The ring formed by the bonding of the above two substituents may have a substituent. The substituent is not particularly limited, and examples thereof include those exemplified above as the substituents of the hydrocarbon group that the 5-membered heterocycle has.

Examples of the azole compound include an imidazole compound in which one of the atoms constituting the azole ring is a nitrogen atom, a pyrazole compound in which two of the atoms constituting the azole ring are nitrogen atoms, a thiazole compound in which one of the atoms constituting the azole ring is a nitrogen atom and the other is a sulfur atom, a triazole compound in which three of the atoms constituting the azole ring are nitrogen atoms, and a tetrazole compound in which four of the atoms constituting the azole ring are nitrogen atoms.

Examples of the imidazole compound include imidazole, 1-methylimidazole, 2-methylimidazole, 5-methylimidazole, 1,2-dimethylimidazole, 2-mercaptoimidazole, 4,5-dimethyl-2-mercaptoimidazole, 4-hydroxyimidazole, 2,2'-biimidazole, 4-imidazole carboxylic acid, histamine, a benzimidazole compound having a benzimidazole skeleton formed by the condensation of an imidazole ring and a benzene ring, and a purine compound having a purine skeleton formed by the condensation of an imidazole ring and a pyrimidine ring.

As the imidazole compound, among these, a benzimidazole compound or a purine compound is preferable, and a purine compound is more preferable.

Examples of the benzimidazole compound include benzimidazole, 2-aminobenzimidazole, and 2-mercaptobenzimidazole.

Examples of the purine compound include adenine, guanine, and purine.

Examples of the pyrazole compound include pyrazole, 4-pyrazolecarboxylic acid, 1-methylpyrazole, 3-methylpyrazole, 3-amino-5-hydroxypyrazole, 3-aminopyrazole, and 4-aminopyrazole.

Examples of the thiazole compound include 2,4-dimethylthiazole, benzothiazole, and 2-mercaptobenzothiazole.

As the triazole compound, a compound having a benzotriazole skeleton is preferable which is formed in a case where two adjacent substituents on the triazole ring are bonded and form a benzene ring.

Examples of the compound having a benzotriazole skeleton include benzotriazole, 5-methyl-1H-benzotriazole (CAS registry number: 136-85-6), tolyl triazole (CAS registry number: 29385-43-1), 5-aminobenzotriazole, 1-hydroxybenzotriazole, 4-carboxybenzotriazole, 5,6-dimethylbenzotriazole, 1-[N,N-bis(hydroxyethyl)amino ethyl]benzotriazole, 1-(1,2-dicarboxyethyl)benzotriazole, 1-[N,N-bis(2-ethylhexyl)aminomethyl]benzotriazole, 1-[N,N-bis(2-ethylhexyl)aminomethyl]methylbenzotriazole, 2,2'-[(5-methyl-1H-benzotriazol-1-yl)methyl]imino diethanol, and carboxybenzotriazole.

Examples of the triazole compound other than the compound having a benzotriazole skeleton include 1,2,4-triazole, 3-methyl-1,2,4-triazol, 3-amino-1,2,4-triazole, 1,2,3-triazole, and 1-methyl-1,2,3-triazol.

Examples of the tetrazole compound include 1H-tetrazole (1,2,3,4-tetrazole), 5-methyl-1,2,3,4-tetrazole, 5-amino-1,2, 3,4-tetrazole, 1,5-pentamethylenetetrazole, 1-phenyl-5-mercaptotetrazole, and 1-(2-dimethylaminoethyl)-5-mercaptotetrazole.

As the azole compound, in view of an excellent corrosion inhibition effect on copper and cobalt, a triazole compound or a tetrazole compound is preferable. In another aspect, the azole compound is preferably a triazole compound, a pyrazole compound, or an imidazole compound. Among these, a triazole compound is more preferable, and a compound having a benzotriazole skeleton is even more preferable.

In the present specification, the azole compound having the aforementioned specific structure includes a tautomer thereof.

One kind of azole compound may be used alone, or two or more kinds of azole compounds may be used in combination.

In view of higher etching selectivity, the content of the azole compound (total content in a case where the composition contains a plurality of azole compounds) with respect to the total mass of the composition is preferably 0.005% by mass or more, more preferably more than 0.02% by mass, and even more preferably 0.08% by mass or more.

Furthermore, in view of higher dissolving ability for metal-containing substances, the content of the azole compound with respect to the total mass of the composition is preferably 5.0% by mass or less, more preferably 2.0% by mass or less, even more preferable less than 1.0% by mass, and particularly preferably 0.3% by mass or less.

In order that excellent dissolving ability and excellent etching selectivity for metal-containing substances are well balanced, the ratio of the content of the periodic acid compound to the content of the azole compound (content of periodic acid compound/content of azole compound) as a mass ratio is preferably 1 to 500, more preferably 10 to 200, and even more preferably 15 to 100.

<Alkali Compound>

The composition according to the embodiment of the present invention contains an alkali compound.

The alkali compound is not particularly limited as long as it is a compound having a pH of 7 or higher in a case where the compound is made into an aqueous solution by being dissolved in water. Examples thereof include an organic base, an inorganic base, and salts thereof.

The alkali compound may be ionized in the composition.

Examples of the organic base include a quaternary ammonium salt compound, a water-soluble amine, and a quaternary phosphonium salt compound. Among these, a quaternary ammonium salt compound or a water-soluble amine is preferable.

(Quaternary Ammonium Salt Compound)

The quaternary ammonium salt compound is not particularly limited as long as it is a compound having a quaternary ammonium cation formed by the substitution of a nitrogen atom with 4 hydrocarbon groups (preferably alkyl groups).

Examples of the quaternary ammonium salt compound include quaternary ammonium hydroxide, quaternary ammonium fluoride, quaternary ammonium bromide, quaternary ammonium iodide, quaternary ammonium acetate, and quaternary ammonium carbonate. Among these, quaternary ammonium hydroxide is preferable, and a compound represented by Formula (1) is more preferable.

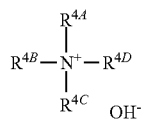

Formula (1)

In Formula (1), $R^{4A}$ to $R^{4D}$ each independently represent an alkyl group having 1 to 6 carbon atoms (preferably a methyl group, an ethyl group, a propyl group, or a butyl group), a hydroxyalkyl group having 1 to 6 carbon atoms (preferably a hydroxymethyl group, a hydroxyethyl group, or a hydroxybutyl group), a benzyl group, or an aryl group (preferably a phenyl group, a naphthyl group, or a naphthalene group). Among these, an alkyl group having 1 to 6 carbon atoms, a hydroxyethyl group having 1 to 6 carbon atoms, or a benzyl group is preferable.

As the compound represented by Formula (1), at least one quaternary ammonium hydroxide salt is preferable which is selected from the group consisting of tetramethylammonium hydroxide (TMAH), ethyltrimethylammonium hydroxide (ETMAH), tetraethylammonium hydroxide (TEAH), tetrabutylammonium hydroxide (TBAH), dimethyldipropylammonium hydroxide, trimethylhydroxyethylammonium hydroxide, methyltri(hydroxyethyl)ammonium hydroxide, tetra(hydroxyethyl)ammonium hydroxide, trimethylbenzylammonium hydroxide, bishydroxyethyldimethylammonium hydroxide, and choline, and at least one compound selected from the group consisting of TMAH, ETMAH, TEAH, and TBAH is more preferable.

Furthermore, the quaternary ammonium hydroxide compound described in JP2015-518068A may be also used. In view of an effect of removing metal-containing substances, few metal residues after use, economic feasibility, and stability of the composition, TMAH (tetramethylammonium hydroxide), ETMAH (ethyltrimethylammonium hydroxide), TEAH (triethylammonium hydroxide), dimethyldipropylammonium hydroxide, bishydroxyethyldimethylammonium hydroxide, or trimethyl(hydroxyethyl)ammonium hydroxide is preferable.

One kind of quaternary ammonium salt compound may be used alone, or two or more kinds of quaternary ammonium salt compounds may be used.

(Water-Soluble Amine)

In the present specification, the water-soluble amine means an amine which can dissolve in an amount of 50 g or more in 1 L of water. The pKa of the water-soluble amine is not particularly limited, and is preferably 7.5 to 13.0. The water-soluble amine does not include ammonia.

Examples of the water-soluble amine having a pKa of 7.5 to 13.0 include diglycolamine (DGA) (pKa=9.80), methylamine (pKa=10.6), ethylamine (pKa=10.6), propylamine (pKa=10.6), butylamine (pKa=10.6), pentylamine (pKa=10.0), monoethanolamine (pKa=9.3), propanolamine (pKa=9.3), butanol amine (pKa=9.3), methoxyethylamine (pKa=10.0), methoxypropylamine (pKa=10.0), dimethylamine (pKa=10.8), diethylamine (pKa=10.9), diamine propylamine (pKa=10.8), trimethylamine (pKa=9.80), and triethylamine (pKa=10.72).

As the water-soluble amine, unsubstituted hydroxylamine and a hydroxylamine derivative may also be used.

In the present specification, the pKa of the water-soluble amine is an acid dissociation constant in water. The acid dissociation constant in water can be measured using a spectrometer and potentiometry in combination.

As the water-soluble amine, aminoalcohol is preferable. The aminoalcohol is one of the water-soluble amines that has at least one more hydroxylalkyl group in the molecule.

Examples of the aminoalcohol included in the water-soluble amine include monoethanolamine (MEA), diethanolamine (DEA), triethanolamine (TEA), diethylene glycolamine (DEGA), trishydroxymethylaminomethane (Tris), 2-(methylamino)-2-methyl-1-propanol (N-MAMP), 2-(dimethylamino)-2-methyl-1-propanol (DMAMP), 2-(aminoethoxy)ethanol (AEE), and 2-(2-aminoethylamino)ethanol (AAE).

Among these, N-MAMP, DMAMP, MEA, DEA, AEE, or AAE is preferable, and N-MAMP, DMAMP, MEA, or AEE is more preferable.

(Quaternary Phosphonium Salt Compound)

The quaternary phosphonium salt compound is not particularly limited as long as it is a compound having a quaternary phosphonium cation formed by the substitution of a phosphorus atom with 4 hydrocarbon groups.

Examples of the quaternary phosphonium salt compound include quaternary phosphonium hydroxide, quaternary phosphonium fluoride, quaternary phosphonium bromide, quaternary phosphonium iodide, quaternary phosphonium acetate, and quaternary phosphonium carbonate. Among these, quaternary phosphonium hydroxide is preferable.

Examples of the 4 hydrocarbon groups that the quaternary phosphonium salt compound has on a phosphorus atom include an alkyl group having 1 to 6 carbon atoms (preferably a methyl group, an ethyl group, a propyl group, or a butyl group), a hydroxyalkyl group having 1 to 6 carbon atoms (preferably a hydroxymethyl group, a hydroxyethyl group, or a hydroxybutyl group), a benzyl group, and an aryl group (preferably a phenyl group, a naphthyl group, or a naphthalene group). Among these, an alkyl group having 1 to 6 carbon atoms, a hydroxyethyl group having 1 to 6 carbon atoms, or a benzyl group is preferable, and an alkyl group having 1 to 6 carbon atoms is more preferable.

As the quaternary phosphonium salt compound, tetramethylphosphonium hydroxide, ethyltrimethylphosphonium hydroxide, tetraethylphosphonium hydroxide, tetrabutylphosphonium hydroxide, dimethyldipropylphosphonium hydroxide, trimethylhydroxyethylphosphonium hydroxide, methyltri(hydroxyethyl)phosphonium hydroxide, tetra (hydroxyethyl)phosphonium hydroxide, trimethylbenzylphosphonium hydroxide, or bishydroxyethyldimethylphosphonium hydroxide is preferable.

One kind of quaternary phosphonium salt compound may be used alone, or two or more kinds of quaternary phosphonium salt compounds may be used in combination.

(Inorganic Base)

Examples of the inorganic base include an alkali metal hydroxide, an alkaline earth metal hydroxide, and ammonia.

Examples of the alkali metal hydroxide include lithium hydroxide, sodium hydroxide, potassium hydroxide, and cesium hydroxide. Examples of the alkaline earth metal hydroxide include calcium hydroxide, strontium hydroxide, and barium hydroxide.

As the inorganic base, ammonia, sodium hydroxide, or potassium hydroxide is preferable, and ammonia or potassium hydroxide is more preferable.

As the alkali compound, quaternary ammonium hydroxide, a water-soluble amine (more preferably aminoalcohol), ammonia, or potassium hydroxide is preferable, and quaternary ammonium hydroxide, ammonia, or a water-soluble amine is more preferable.

Among these, in view of an effect of removing metal-containing substances, few metal residues after use, economic feasibility, and stability of the composition, quaternary ammonium hydroxide is even more preferable, and tetramethylammonium hydroxide, ethyltrimethylammonium hydroxide, dimethyldipropylammonium hydroxide, or tetraethylammonium hydroxide is particularly preferable.

One kind of alkali compound may be used alone, or two or more kinds of alkali compounds may be used in combination.

In view of higher etching selectivity, the content of the alkali compound (total content in a case where the composition contains a plurality of alkali compounds) with respect to the total mass of the composition is preferably 0.1% by mass or more, more preferably more than 0.5% by mass, and even more preferably 2.0% by mass or more.

Furthermore, in view of higher temporal stability of the composition, the content of the alkali compound with respect to the total mass of the composition is preferably 20.0% by mass or less, more preferably 12.0% by mass or less, and even more preferably 8.0% by mass or less.

In addition, it is preferable that the content of the alkali compound contained in the composition be adjusted to fall into the suitable range described above so that the pH of the composition falls into the suitable range that will be described later.

In order that excellent etching selectivity and excellent temporal stability of the composition are well balanced, the ratio of the content of the periodic acid compound to the content of the alkali compound (content of periodic acid compound/content of alkali compound) as a mass ratio is preferably 0.3 to 3.0, more preferably 0.5 to 2.0, and even more preferably more than 1.0 and less than 1.8.

<Optional Components>

The composition may contain other optional components in addition to the components described above. Hereinafter, the optional components will be described.

(Solvent)

The composition may contain a solvent.

Examples of the solvent include water and a water-soluble organic solvent.

—Water—

Water is not particularly limited, and is preferably water having undergone a purification treatment such as distilled water, deionized water, or ultrapure water, and more preferably ultrapure water used for manufacturing semiconductors. Water to be incorporated into the composition may contain a trace of components that are unavoidably mixed in.

The content of water in the composition is not particularly limited, and is preferably 50% by mass or more, more preferably 65% by mass or more, and even more preferably 75% by mass or more. The upper limit thereof is not particularly limited, and is preferably 98% by mass or less, more preferably 95% by mass or less, and even more preferably 90% by mass or less.

—Water-Soluble Organic Solvent—

In view of higher dissolving ability for metal-containing substances, the composition preferably contains a water-soluble organic solvent.

Examples of the water-soluble organic solvent include an ether-based solvent, an alcohol-based solvent, a ketone-based solvent, an amide-based solvent, a sulfur-containing solvent, and a lactone-based solvent. Furthermore, the water-soluble organic solvent is preferably an organic solvent that can be mixed with water at any ratio.

The ether-based solvent is not particularly limited as long as it is a compound having an ether bond (—O—). Examples thereof include diethyl ether, diisopropyl ether, dibutyl ether, t-butyl methyl ether, cyclohexyl methyl ether, tetrahydrofuran, diethylene glycol, dipropylene glycol, triethylene glycol, polyethylene glycol, alkylene glycol monoalkyl ether (ethylene glycol monomethyl ether, ethylene glycol monobutyl ether, propylene glycol monomethyl ether, diethylene glycol monomethyl ether, dipropylene glycol monomethyl ether, tripropylene glycol monomethyl ether, and diethylene glycol monobutyl ether), and alkylene glycol dialkyl ether (diethylene glycol diethyl ether, diethylene glycol dipropyl ether, diethylene glycol dibutyl ether, triethylene glycol diethyl ether, tetraethylene glycol dimethyl ether, tetraethylene glycol diethyl ether, ethylene glycol dimethyl ether, diethylene glycol dimethyl ether, and triethylene glycol dimethyl ether).

In the present specification, a compound having both the hydroxyl group and ether bond (—O—) is included in the ether-based solvent.

The number of carbon atoms in the ether-based solvent is not particularly limited, and is preferably 3 to 16, more preferably 4 to 14, and even more preferably 6 to 12.

Examples of the alcohol-based solvent include methanol, ethanol, 1-propanol, 2-propanol, 1-butanol, 2-butanol, ethylene glycol, propylene glycol, glycerin, 1,6-hexanediol, cyclohexanediol, sorbitol, xylitol, 2-methyl-2,4-pentanediol, 1,3-butanediol, and 1,4-butanediol.

The number of carbon atoms in the alcohol-based solvent is not particularly limited, and is preferably 1 to 8 and more preferably 1 to 4.

Examples of the ketone-based solvent include acetone, methyl ethyl ketone, methyl isobutyl ketone, and cyclohexanone.

Examples of the amide-based solvent include formamide, monomethylformamide, dimethylformamide, acetamide, monomethylacetamide, dimethylacetamide, monoethylacetamide, diethylacetamide, and N-methylpyrrolidone.

Examples of the sulfur-containing solvent include dimethyl sulfone, dimethyl sulfoxide, and sulfolane.

Examples of the lactone-based solvent include γ-butyrolactone and δ-valerolactone.

As the water-soluble organic solvent, an ether-based solvent or an alcohol-based solvent is preferable, alkylene glycol monoalkyl ether or alkylene glycol dialkyl ether is more preferable, and alkylene glycol dialkyl ether is even more preferable.

The molecular weight of the water-soluble organic solvent (weight-average molecular weight in a case where the solvent has molecular weight distribution) is preferably less than 500, and more preferably 300 or less. The lower limit thereof is not particularly limited, and is preferably 30 or more.

As the water-soluble organic solvent, a compound represented by Formula (2) is also preferable.

$$R_{21}\text{—}(\text{—O—}R_{23}\text{—})_{m2}\text{—O—}R_{22} \quad (2)$$

In Formula (2), $R_{21}$ and $R_{22}$ each independently represent a hydrogen atom or an alkyl group having 1 to 5 carbon atoms. It is preferable that at least one of $R_{21}$ or $R_{22}$ represent an alkyl group having 1 to 5 carbon atoms. It is more preferable that $R_{21}$ and $R_{22}$ both represent an alkyl group having 1 to 5 carbon atoms. It is even more preferable that $R_{21}$ and $R_{22}$ both represent an alkyl group having 1 to 4 carbon atoms.

$R_{23}$ represents a linear or branched alkylene group having 1 to 4 carbon atoms. In a case where there is a plurality of $R_{23}$'s, $R_{23}$'s may be the same or different from each other. As $R_{23}$, an ethylene group or a 1,2-propylene group is preferable, and an ethylene group is more preferable.

m2 represents an integer of 1 to 6. m2 is preferably an integer of 1 to 4, and more preferably an integer of 2 to 4.

The total number of carbon atoms in the alkyl groups represented by $R_{21}$ and $R_{22}$ and in the alkylene group represented by $R_{23}$ contained in the compound represented by Formula (2) is preferably 3 to 16, more preferably 4 to 14, and even more preferably 6 to 12.

As the water-soluble organic solvent, particularly, diethylene glycol monoethyl ether, diethylene glycol monobutyl ether, diethylene glycol diethyl ether, diethylene glycol dibutyl ether, triethylene glycol diethyl ether, or tetraethylene glycol dimethyl ether is preferable, and diethylene glycol diethyl ether, diethylene glycol dibutyl ether, or tetraethylene glycol dimethyl ether is more preferable.

In a case where the composition contains a water-soluble organic solvent, in view of higher dissolving ability for metal-containing substances (particularly a Ru-containing substance), the content of the water-soluble organic solvent with respect to the total mass of the composition is preferably 0.1% by mass or more, more preferably 1% by mass or more, and even more preferably 3% by mass or more. The upper limit thereof is not particularly limited. However, in view of higher dissolving ability for metal-containing substances (particularly, a Ru-containing substance), the upper limit is preferably 30% by mass or less, more preferably less than 20% by mass, and even more preferably 18% by mass or less.

One kind of water-soluble organic solvent may be used alone, or two or more kinds of water-soluble organic solvents may be used. In a case where two or more kinds of water-soluble organic solvents are used, the total content thereof is preferably within the above range.

In addition, in view of higher dissolving ability for metal-containing substances, the ratio of the content of the water-soluble organic solvent to the content of the azole compound (content of water-soluble organic solvent/content of azole compound) as a mass ratio is preferably 10 or more, more preferably 15 or more, and even more preferably 30 or more. The upper limit thereof is not particularly limited, and is preferably 600 or less, more preferably 400 or less, and even more preferably 160 or less.

(Surfactant)

The composition may contain a surfactant.

The surfactant is not particularly limited as long as it is a compound having a hydrophilic group and a hydrophobic group (lipophilic group) in one molecule. Examples of the surfactant include an anionic surfactant, a cationic surfactant, a nonionic surfactant, and an amphoteric surfactant.

In view of higher etching selectivity, the composition preferably contains a surfactant.

The hydrophobic group of the surfactant is not particularly limited, and examples thereof include an aliphatic hydrocarbon group, an aromatic hydrocarbon group, and a combination thereof. In a case where the hydrophobic group includes an aromatic hydrocarbon group, the number of carbon atoms in the hydrophobic group is preferably 6 or more, and more preferably 10 or more. In a case where the hydrophobic group does not include an aromatic hydrocarbon group and is composed of only an aliphatic hydrocarbon group, the number of carbon atoms in the hydrophobic group is preferably 8 or more, and more preferably 10 or more. The upper limit of the number of carbon atoms in the hydrophobic group is not particularly limited, and is preferably 24 or less, and more preferably 20 or less.

Examples of the anionic surfactant include an anionic surfactant having at least one hydrophilic group selected from the group consisting of a sulfonic acid group, a carboxy group, a sulfuric acid ester group, and a phosphonic acid group in the molecule.

Examples of the anionic surfactant having a sulfonic acid group in the molecule include alkylsulfonic acid, alkylbenzenesulfonic acid, alkylnaphthalenesulfonic acid, alkyldiphenylether sulfonic acid, fatty acid amide sulfonic acid, and salts thereof.

Examples of the anionic surfactant having a carboxylic acid group in the molecule include polyoxyethylene alkyl ether carboxylic acid, polyoxyethylene alkyl ether acetic acid, polyoxyethylene alkyl ether propionic acid, a fatty acid, and salts thereof.

The salts listed above as specific examples of the anionic surfactant are not particularly limited, and examples thereof include an ammonium salt, a sodium salt, a potassium salt, and a tetramethylammonium salt.

As the anionic surfactant, a sulfonic acid-based anionic surfactant is preferable, and alkylsulfonic acid, alkylbenzenesulfonic acid, or salts thereof are more preferable.

The cationic surfactant is not particularly limited as long as it is a compound having a cationic hydrophilic group and the aforementioned hydrophobic group. Examples of the cationic surfactant include a quaternary ammonium salt-based surfactant and an alkyl pyridium-based surfactant.

Examples of the amphoteric surfactant include a betaine-based surfactant, an amino acid-based surfactant, and an amine oxide-based surfactant.

Examples of the betaine-based surfactant include a compound having a cation structure selected from a quaternary ammonium cation and an imidazole cation (preferably a quaternary ammonium cation structure) and an anion structure selected from a carboxy group, a sulfo group, and salts thereof (preferably an anion structure which is a carboxy group or a salt thereof).

As the betaine-based surfactant, alkyl-N,N-dimethylaminoacetic acid betaine, alkylamide propyl-N, N-dimethylaminoacetic acid betaine, or 2-alkyl-N-carboxymethyl-N-hydroxyethyl imidazolinium betaine is preferable, lauryldimethylaminoacetic acid betaine, stearyldimethylaminoacetic acid betaine, coconut oil alkyldimethylaminoacetic acid betaine, or N-lauric acid amidopropyldimethylaminoacetic acid betaine is more preferable.

Examples of the amino acid-based surfactant include an alkylamino fatty acid, an alkylamino di-fatty acid, and salts thereof. Among these, sodium N-laurylaminopropionate or sodium N-laurylaminodipropionate is preferable.

Examples of the amine oxide-based surfactant include alkyldimethylamine oxide and alkylamidopropyldimethylamine oxide. Specifically, examples thereof include N-lauric acid amidopropyldimethylamine oxide.

Examples of the nonionic surfactant include a polyalkylene oxide alkylphenyl ether-based surfactant, a polyalkylene oxide alkyl ether-based surfactant, a block polymer-based surfactant consisting of polyethylene oxide and polypropylene oxide, a polyoxyalkylene di-styrenated phenyl ether-based surfactant, a polyalkylene tribenzyl phenyl ether-based surfactant, and an acetylene polyalkylene oxide-based surfactant.

As the surfactant, an anionic surfactant or an amphoteric surfactant is preferable, an amphoteric surfactant is more preferable, and a betaine-based surfactant having a quaternary ammonium cation structure and an anion structure which is a carboxy group or a salt thereof is even more preferable.

In a case where the composition contains a surfactant, in view of higher etching selectivity, the content of the water-soluble organic solvent with respect to the total mass of the composition is preferably 0.01% by mass or more, and more preferably 0.03% by mass or more. The upper limit is not particularly limited. However, in view of suppressing foaming of the composition, the upper limit thereof is preferably 10% by mass or less, and more preferably 5% by mass or less.

One kind of surfactant may be used alone, or two or more kinds of surfactants may be used. In a case where two or more kinds of surfactants are used, the total content thereof is preferably within the above range.

(Organic Acid)

The composition may contain an organic acid.

The organic acid is an organic compound that has an acidic functional group and exhibits acidity (pH less than 7.0) in an aqueous solution. Examples of the acidic functional group include a carboxyl group, a phosphonic acid group, a sulfo group, a phenolic hydroxyl group, and a mercapto group.

In the present specification, periodic acid, a compound that functions as an anionic surfactant, and an oxidant that will be described later are not included in the organic acid.

The organic acid is not particularly limited, and examples thereof include a carboxylic acid having a carboxyl group in the molecule, a phosphonic acid having a phosphonic acid group in the molecule, and a sulfonic acid having a sulfo group in the molecule. Among these, a carboxylic acid or a phosphonic acid is preferable.

The number of functional groups contained in the organic acid is not particularly limited, and is preferably 1 to 4, and more preferably 1 to 3.

The organic acid is preferably a compound that functions as a metal chelator. The organic acid is preferably a compound having two or more functional groups (coordinating groups) that form a coordinate bond with a metal ion in the molecule. Examples of the coordinating group include the aforementioned functional groups. Among those, a carboxylic acid group or a phosphonic acid group is preferable.

—Carboxylic Acid—

The composition may contain a carboxylic acid.

The carboxylic acid is a compound having one or more carboxy groups or a salt thereof. The aforementioned anionic surfactant having a carboxylic acid group and a hydrophobic group in the molecule is not included in the carboxylic acid.

In view of higher etching selectivity, the composition preferably contains a carboxylic acid.

One kind of carboxylic acid may be used alone, or two or more kinds of carboxylic acids may be used.

As the carboxylic acid, a carboxylic acid having no nitrogen atom is preferable.

Examples of the carboxylic acid having no nitrogen atom include citric acid, lactic acid, acetic acid, propionic acid, malic acid, tartaric acid, malonic acid, oxalic acid, succinic acid, gluconic acid, glycolic acid, diglycolic acid, maleic acid, benzoic acid, phthalic acid, salicylic acid, salicylhydroxamic acid, phthalhydroxamic acid, and formic acid.

Among these, citric acid, lactic acid, acetic acid, malic acid, tartrate, malonic acid, oxalic acid, glycolic acid, phthalic acid, salicylhydroxamic acid, or phthalhydroxamic acid is preferable, and citric acid, lactic acid, acetic acid, malic acid, tartaric acid, malonic acid, oxalic acid, or glycolic acid is more preferable.

Examples of a carboxylic acid having a nitrogen atom include an amino acid and an aminopolycarboxylic acid.

Examples of amino acid include glycine, alanine, asparagine, aspartic acid, arginine, glutamine, glutamic acid, histidine, serine, cysteine, tyrosine, and phenylalanine.

Examples of the aminopolycarboxylic acid include ethylenediaminetetraacetate, diethylenetriaminepentaacetate (DTPA), hydroxyethylethylenediamine triacetate, dihydroxyethylethylenediaminetetraacetate, nitrilotriacetate, hydroxyethyliminodiacetate, β-alanine diacetate, aspartic acid diacetate, methylglycine diacetate, iminodisuccinate, serine diacetate, hydroxyiminodisuccinate, a dihydroxyethylglycine salt, aspartate, and glutamate.

—Phosphonic Acid—

The phosphonic acid may be a monophosphonic acid having one phosphonic acid group or a polyphosphonic acid having two or more phosphonic acid groups. Among these, a polyphosphonic acid having two or more phosphonic acid groups is preferable.

The number of phosphonic acid groups contained in the phosphonic acid is preferably 2 to 5, more preferably 2 to 4, and even more preferably 2 or 3.

The number of carbon atoms in the phosphonic acid is preferably 12 or less, more preferably 10 or less, and even more preferably 8 or less. The lower limit thereof is not particularly limited, and is preferably 1 or more.

As the polyphosphonic acid, the compounds represented by General Formulas [1] to [3] described in paragraphs [0013] to [0023] of WO2013/162020A, the compounds described in paragraphs [0026] to [0036] of WO2018/020878A, and the compounds ((co)polymers) described in paragraphs [0031] to [0046] of WO2018/030006A can be used. What are described in these paragraphs are incorporated into the present specification.

Examples of the polyphosphonic acid include ethylidene diphosphonic acid, 1-hydroxyethylidene-1,1'-diphosphonic acid (HEDP), 1-hydroxypropylidene-1,1'-diphosphonic acid, and 1-hydroxybutylidene-1,1'-diphosphonic acid, ethylaminobis(methylenephosphonic acid), dodecylaminobis(methylenephosphonic acid), nitrilotris(methylenephosphonic acid) (NTPO), ethylenediamine bis(methylenephosphonic acid) (EDDPO), 1,3-propylenediamine bis(methylenephosphonic acid), ethylenediaminetetra(methylenephosphonic acid) (EDTPO), ethylenediaminetetra(ethylenephosphonic acid), 1,3-propylenediaminetetra(methylenephosphonic acid) (PDTMP), 1,2-diaminopropanetetra(methylenephosphonic acid), 1,6-hexamethylenediaminetetra(methylenephosphonic acid), diethylenetriaminepenta (methylenephosphonic acid) (DEPPO), diethylenetriaminepenta(ethylenephosphonic acid), triethylenetetraminehexa(methylenephosphonic acid), and triethylenetetraminehexa(ethylenephosphonic acid). Among these, HEDP is preferable.

In a case where the composition contains an organic acid (preferably a carboxylic acid), the content of the organic acid (preferably a carboxylic acid) is not particularly limited. The content of the organic acid with respect to the total mass of the composition is preferably 0.001% to 10% by mass, more preferably 0.01% to 5% by mass, and even more preferably 0.01% to 3% by mass.

One kind of organic acid may be used alone, or two or more kinds of organic acids may be used. In a case where two or more kinds of organic acids are used, the total content thereof is preferably within the above range.

Furthermore, in a case where the composition contains two or more kinds of organic acids, an aspect is also preferable in which the organic acids include at least one carboxylic acid at least one phosphonic acid.

(Oxidant Other than Periodic Acid Compound)

The composition may contain an oxidant other than the aforementioned periodic acid compound.

Examples of the oxidant other than the periodic acid compound include hydrogen peroxide, peroxide, nitric acid and a salt thereof, iodic acid and a salt thereof, hypochlorous acid and a salt thereof, chlorous acid and a salt thereof, chloric acid and a salt thereof, perchloric acid and a salt thereof, persulfate and a salt thereof, bichromic acid and a salt thereof, permanganic acid and a salt thereof, permanganic acid and its salt, ozonated water, a silver (II) salt, and an iron (III) salt.

In a case where the composition contains an oxidant other than the periodic acid compound, the sum of the content of the periodic acid and the content of the oxidant other than the periodic acid compound is preferably within the range of the content of the periodic acid described above.

Furthermore, the content of the oxidant other than the periodic acid compound contained in the composition is preferably smaller than the content of the periodic acid. It is more preferable that the composition do not contain an oxidant other than the periodic acid compound.

(pH Adjuster)

The present composition may contain a pH adjuster other than the alkali compound and organic acid described above.

Examples of the pH adjuster other than the alkali compound and the organic acid include inorganic acids such as sulfuric acid, hydrochloric acid, and acetic acid.

(Additives)

As long as the effects of the present invention and the function of each component are not impaired, the present composition may additionally contain components other than the components described above.

The present composition may contain a polymer compound as an additive.

The polymer compound is an organic compound other than the components described above, and has a molecular weight (weight-average molecular weight in a case where the compound has molecular weight distribution) of 500 or more.

Examples of the polymer compound include a polyhydroxy compound and an anionic polymer compound.

In the present specification, the weight-average molecular weight is a polystyrene-equivalent molecular weight determined by gel permeation chromatography (GPC). GPC is based on a method using HLC-8020GPC (manufactured by Tosoh Corporation), columns consisting of TSKgeL SuperHZM-H, TSKgeL SuperHZ4000, and TSKgeL SuperHZ2000 (manufactured by Tosoh Corporation, 4.6 mm ID×15 cm), and tetrahydrofuran (THF) as an eluent.

—Polyhydroxy Compound—

A polyhydroxy compound is an organic compound having two or more (for example, 2 to 200) alcoholic hydroxyl groups in the molecule.

The molecular weight of the polyhydroxy compound (weight-average molecular weight in a case where having the compound has molecular weight distribution) is 500 or more, and preferably 500 to 3,000.

Examples of the polyhydroxy compound include polyoxyalkylene glycol such as polyethylene glycol, polypropylene glycol, and polyoxyethylene polyoxypropylene glycol; oligosaccharide such as mannotriose, cellotriose, gentianose, raffinose, melletitose, cellotetraose, and stachyose; and polysaccharides and hydrolysates thereof such as starch, glycogen, cellulose, chitin, and chitosan.

As the polyhydroxy compound, cyclodextrin is also preferable. Cyclodextrin is a sort of cyclic oligosaccharide having a cyclic structure composed of a plurality of D-glucose molecules bonded to each other by a glycosidic bond. As the cyclodextrin, a compound composed of 5 or more (for example, 6 to 8) glucose molecules bonded to each other is known.

Examples of the cyclodextrin include α-cyclodextrin, β-cyclodextrin, and γ-cyclodextrin. Among these, γ-cyclodextrin is preferable.

—Anionic Polymer Compound—

The anionic polymer compound is a compound having an anionic group and a weight-average molecular weight of 500 or more.

Examples of the anionic polymer compound include polymers having a monomer having a carboxyl group as a basic constitutional unit, salts thereof, and copolymers containing them. Specifically, examples thereof include a polyacrylic acid, a salt thereof, and a copolymer including these; a polymethacrylic acid, a salt thereof, and a copolymer including these; a polyamic acid, a salt thereof, and a copolymer including these; and a polyacrylic acid, such as polymaleic acid, polyitaconic acid, polyfumaric acid, poly(p-styrene carboxylic acid), or polyglioxylic acid, a salt thereof, and a copolymer including these.

Among these, at least one kind of compound selected from the group consisting of a polyacrylic acid, a polymethacrylic acid, a copolymer including a polyacrylic acid and a polymethacrylic acid, and salts thereof is preferable.

The weight-average molecular weight of the anionic polymer compound is preferably 1,000 to 100,000, and more preferably 2,000 to 50,000.

The anionic polymer compound may be ionized in the composition.

One kind of polymer compound may be used alone, or two or more kinds of polymer compounds may be used.

In a case where the present composition contains a polymer compound, the content thereof with respect to the total mass of the composition is preferably 0.001% to 10% by mass, and more preferably 0.005% to 5% by mass.

<pH>

The pH of the present composition is not particularly limited. In view of higher etching selectivity, the pH of is preferably 7.0 or higher, more preferably 7.5 or higher, and even more preferably 8.0 or higher. The upper limit thereof is not particularly limited, and may be 14.0 or less. In view of excellent temporal stability of the composition, the pH of the composition is preferably 13.0 or less, and more preferably 11.5 or less.

In the present specification, the pH of the composition and the first and second liquids that will be described later is measured at 25° C. by using a pH meter (F-51 (trade name) manufactured by HORIBA, Ltd).

<Kit>

The present composition may be a kit in which each component (raw material) is divided into a plurality of parts. The kit according an embodiment of the present invention includes at least a first liquid and a second liquid, and a periodic acid compound, an azole compound, and an alkali compound are contained in any of the first liquid or the second liquid. The kit according to the embodiment of the present invention is used to prepare the present composition by mixing together the first liquid and the second liquid.

As the kit, in view of excellent storage stability, a kit is preferable which includes at least a first liquid that contains a periodic acid compound and an alkali compound and a second liquid that contains an azole compound.

(First Liquid)

The first liquid preferably contains a periodic acid compound and an alkali compound, and more preferably further contains a solvent (more preferably water).

The content of the periodic acid compound in the first liquid is not particularly limited. The content with respect to the total mass of the first liquid is preferably 0.1% by mass or more, more preferably 1.0% by mass or more, and even more preferably 4.0% by mass or more. The upper limit thereof is not particularly limited, and is preferably 60.0% by mass or less, more preferably 40.0% by mass or less, and even more preferably 20.0% by mass or less. It is preferable that the content be within this range, because then the first liquid can be suitable for being mixed with the second liquid, and the content of the periodic acid compound in the mixed liquid with the second liquid falls into the suitable range described above.

The content of the alkali compound in the first liquid is not particularly limited. In view of excellent temporal stability of the first liquid, the content of the alkali compound with respect to the total mass of the first liquid is preferably 0.3% by mass or more, more preferably 1.0% by mass or more, and even more preferably 3.0% by mass or more. The upper limit thereof is not particularly limited, and is preferably 40.0% by mass or less, more preferably 20.0% by mass or less, and even more preferably 12.0% by mass or less.

It is also preferable to adjust the content of the alkali compound so that the pH of the first liquid falls into a suitable range which will be described later.

It is preferable that the first liquid do not contain components other than the periodic acid compound, the alkali compound, and the solvent. It is more preferable that the first liquid do not contain components other than the periodic acid compound, the alkali compound, and water.

The content of water in the first liquid may be the remainder other than the periodic acid compound and the alkali compound, and is not particularly limited. The content of water is preferably 50% to 95% by mass, and more preferably 65% to 90% by mass.

The pH of the first liquid is not particularly limited. In view of excellent temporal stability of the first liquid, the pH is preferably 5 or higher, and more preferably 8 or higher. The upper limit thereof is not particularly limited, and is preferably 14 or less and more preferably 12 or less.

(Second Liquid)

The second liquid preferably contains at least an azole compound, and more preferably further contains a solvent (more preferably water).

The content of the azole compound in the second liquid is not particularly limited. The content of the azole compound with respect to the total mass of the second liquid is preferably 0.01% by mass or more, more preferably 0.04% by mass or more, and even more preferably 0.1% by mass or more. The upper limit thereof is not particularly limited, and is preferably 10.0% by mass or less, more preferably 2.0% by mass or less, and even more preferably 1.0% by mass or less. It is preferable that the content of the azole compound be within this range, because then the second liquid can be suitable for being mixed with the first liquid, and the content of the azole compound in the mixed liquid with the first liquid falls into the suitable range described above.

Although any of the first or second liquid may contain a water-soluble organic solvent, it is preferable that the second liquid contain the water-soluble organic solvent.

The content of the water-soluble organic solvent in the second liquid is not particularly limited. The content of the water-soluble organic solvent with respect to the total mass of the second liquid is preferably 0.2% to 50% by mass, more preferable 2% to 40% by mass, and even more preferably 5% to 30% by mass.

Although any of the first or second liquid may contain a surfactant, it is preferable that the second liquid contain a surfactant.

The content of the surfactant in the second liquid is not particularly limited. The content of the surfactant with respect to the total mass of the second liquid is preferably 0.02% by mass or more, and more preferably 0.05% by mass or more. The upper limit thereof is not particularly limited. However, in view of suppressing foaming of the composition, the upper limit of the content of the surfactant with respect to the total mass of the second liquid is preferably 10% by mass or less, and more preferably 5% by mass or less.

Any of the first or second liquid may contain a carboxylic acid. In a case where the first liquid contains an alkali compound, it is preferable that the second liquid contain a carboxylic acid. It is preferable that the second liquid contain a carboxylic acid, because then the composition satisfying the aforementioned suitable pH range can be easily prepared by mixing the first liquid containing an alkali compound with the second liquid.

The content of the carboxylic acid in the second liquid is not particularly limited. The content of the carboxylic acid with respect to the total mass of the second liquid is preferably 0.002% to 20% by mass, and more preferably 0.02% to 10% by mass. In a case where the first liquid contains an alkali compound, it is preferable to adjust the content of a carboxylic acid in the second liquid so that the pH of the mixed liquid of the first liquid and the second liquid falls into the aforementioned suitable pH range of the composition.

The second liquid may further contain water.

The content of water in the second liquid is not particularly limited and may be the remainder other than the azole compound, the water-soluble organic solvent, the surfactant, and the carboxylic acid. The content of water in the second liquid is preferably 50% to 95% by mass, and more preferably 65% to 90% by mass.

The pH of the second liquid is not particularly limited, and is preferably 9 or less and more preferably 7 or less. The lower limit thereof is not particularly limited, and may be 0 or more.

The kit may be a kit consisting of three or more liquids that further comprises a third liquid containing at least water in addition to the first liquid and the second liquid.

In view of further simplifying the manufacturing process of the composition, a two-liquid kit comprising only the first liquid and the second liquid is preferable.

(Preparation of Kit)

The method for preparing the kit is not particularly limited. For example, by preparing the first and second liquids described above and then storing them in different containers, a kit for preparing a composition may be prepared.

The method for preparing the first liquid is not particularly limited. Examples thereof include a method of adding periodic acid and an alkali compound to pure water obtained by purification and then performing stirring or the like to prepare the first liquid as a homogeneous aqueous solution.

The method for preparing the second liquid is not particularly limited, and the second liquid may be prepared according to the method for preparing the first liquid.

<Container>

The composition and the first and second liquids that the kit comprises can be stored, transported, and used by being filled into any container. It is preferable to use a container that has a high degree of cleanliness and is unlikely to cause elution of impurities. Examples of the container to be filled with the composition include a "CLEAN BOTTLE" series manufactured by AICELLO CORPORATION, "PURE BOTTLE" manufactured by KODAMA PLASTICS Co., Ltd., and the like. However, the container is not limited to these.

<Manufacturing Method>

The method for manufacturing the composition is not particularly limited. For example, by mixing together the components described above, the composition can be manufactured. There is no particular limitation on the order and/or timing of mixing together the components described above. For example, the composition can be manufactured by a method of sequentially adding a periodic acid compound, an azole compound, an alkali compound, and optional components to a stirrer of a mixer filled with purified pure water and then thoroughly stirring the components so that they are mixed together.

The composition is preferably manufactured by mixing together the first liquid and the second liquid that the aforementioned kit comprises, the first liquid containing a periodic acid compound and an alkali compound and a second liquid containing an azole compound. A method of separately storing the first liquid and the second liquid, mixing together the liquids when the composition needs to be used, and applying the mixture to an object to be treated makes it possible to obtain a composition which maintains a dissolving ability and etching selectivity for metal-containing substances even after long-term storage and has excellent storage stability.

Examples of the method for manufacturing the composition also include a method of adjusting pH to a preset level by using at least a part of the alkali compound and/or a pH adjuster and then mixing together the components, and a method of mixing together the components and then adjusting pH to a preset level by using at least a part of the alkali compound and/or a pH adjuster.

Furthermore, the composition may be manufactured by a method of manufacturing a concentrated solution having a lower water content than the water content of the composition to be used, and diluting the solution with a diluent (preferably water) when the composition needs to be used so that the content is adjusted to a predetermined amount. In addition, the composition may be manufactured by a method of diluting the concentrated solution with a diluent and then adjusting pH to a preset level by using at least a part of the alkali compound and/or a pH adjuster. For diluting the concentrated solution, a predetermined amount of diluent may be added to the concentrated solution or a predetermined amount of concentrated solution may be added to a diluent.

[Object to be Treated]

The present composition is used for removing metal-containing substances on a substrate.

In the present specification, "on a substrate" includes, for example, all of the front and back, the lateral surfaces, and the inside of grooves of a substrate, and the like. The metal-containing substances on a substrate include not only a metal-containing substance which is in direct contact with the surface of the substrate but also a metal-containing substance which is on the substrate via another layer.

Examples of the metals included in the metal-containing substances include a metal M selected from Ru (ruthenium), Ti (titanium), Ta (tantalum), Co (cobalt), Cr (chromium), Hf (hafnium), Os (osmium), and Pt (platinum), Ni (nickel), Mn (manganese), Cu (copper), Zr (zirconium), Mo (molybdenum), La (lanthanum), W (tungsten), and Ir (iridium).

That is, as the metal-containing substances, substances containing the metal M are preferable.

The metal-containing substances may be substances containing a metal (metal atoms), and examples thereof include a simple metal M, an alloy including the metal M, an oxide of the metal M, a nitride of the metal M, and an oxynitride of the metal M.

Furthermore, the metal-containing substance may be a mixture including two or more kinds of compounds among the above.

The oxide, nitride, and oxynitride described above may be a composite oxide, a composite nitride, and a composite oxynitride containing a metal.

The content of metal atoms in each metal-containing substance with respect to the total mass of the metal-containing substance is preferably 10% by mass or more, more preferably 30% by mass or more, and even more preferably 50% by mass or more. The upper limit thereof is 100% by mass because the metal-containing substance may be a metal.

As the metal-containing substance, a Ru-containing substance is preferable. That is, the composition is preferably used for removing a Ru-containing substance on a substrate.

Examples of the Ru-containing substance include simple Ru, an alloy of Ru, an oxide of Ru, a nitride of Ru, and an oxynitride of Ru.

The content of Ru atoms in the Ru-containing substance with respect to the total mass of the Ru-containing substance is preferably 10% by mass or more, more preferably 30% by mass or more, and even more preferably 50% by mass or more. The upper limit thereof is not particularly limited, but may be 100% by mass because the Ru-containing substance may be simple Ru.

The object to be treated is a substrate having metal-containing substances. That is, the object to be treated includes at least a substrate and metal-containing substances on the substrate.

The type of substrate is not particularly limited, and is preferably a semiconductor substrate.

Examples of the substrate include various substrates such as a semiconductor wafer, a glass substrate for a photomask, a glass substrate for liquid crystal display, a glass substrate for plasma display, a substrate for field emission display (FED), a substrate for an optical disk, a substrate for a magnetic disk, and a substrate for a magneto-optical disk.

Examples of materials constituting the semiconductor substrate include silicon, silicon germanium, a Group III-V compound such as GaAs, and any combination of these.

The type of metal-containing substances on the substrate is as described above.

The form of the metal-containing substances on the substrate is not particularly limited. For example, the metal-containing substances may be disposed in the form of a film (metal-containing film), in the form of a wiring line (metal-containing wiring line), or in the form of particles.

As described above, the metal is preferably Ru (ruthenium), and the object to be treated preferably has a substrate and a Ru-containing film, a Ru-containing wiring line, or a particle-like Ru-containing substance which is disposed on the substrate.

As the metal, Cu (copper) or Co (cobalt) is also preferable. As the object to be treated, an object is also preferable which has a substrate and a Cu or Co-containing film, a Cu or Co-containing wiring line, or a particle-like Cu or Co-containing substance disposed on the substrate.

It is also preferable that two or more kinds of metal-containing substances be on a substrate. For example, on a substrate, there may be at least a Ru-containing substance (such as a Ru-containing film, a Ru-containing wiring line, and/or a particle-like Ru-containing substance) and a Cu-containing substance (such as a Cu-containing film, a Cu-containing wiring line, and/or a particle-like Cu-containing substance) or a Co-containing substance (such as a Co-containing film, a Co-containing wiring line, and/or a particle-like Co-containing substance). In a case where there are two or more kinds of metal-containing substances on a substrate, the two or more kinds of metal-containing substances may be in a separated state or in the form of a homogeneous mixture.

Furthermore, two or more kinds of metal-containing substances may be in different forms. For example, there may be a Ru-containing film and a Cu-containing wiring line or a Co-containing wiring line on a substrate.

Examples of the substrate on which a metal-containing substance is disposed in the form of particles include a substrate obtained by performing dry etching on a substrate having a metal-containing film such that particle-like metal-containing substances are then attached to the substrate as residues as will be described later, and a substrate obtained by performing a chemical mechanical polishing (CMP) treatment on a metal-containing film such that particle-like metal-containing substances (such as particle-like metal oxides) are then attached to the substrate as residues as will be described later.

The thickness of the metal-containing film is not particularly limited, and may be appropriately selected according to the use. For example, the thickness of the metal-containing film is preferably 50 nm or less, more preferably 20 nm or less, and even more preferably 10 nm or less.

The metal-containing film may be disposed only on one of the main surfaces of the substrate, or may be disposed on both the main surfaces of the substrate. Furthermore, the metal-containing film may be disposed on the entire main surface of the substrate, or may be disposed on a portion of the main surface of the substrate.

The substrate may have various layers and/or structures as desired, in addition to the metal-containing substances. For example, the substrate may have a metal wire, a gate electrode, a source electrode, a drain electrode, an insulating layer, a ferromagnetic layer, and/or a non-magnetic layer.

The substrate may have the structure of an exposed integrated circuit, for example, an interconnection mechanism such as a metal wire and a dielectric material. Examples of metals and alloys used in the interconnect mechanism include aluminum, a copper-aluminum alloy, copper, titanium, tantalum, cobalt, silicon, titanium nitride, tantalum nitride, and tungsten. The substrate may have a layer of silicon oxide, silicon nitride, silicon carbide, and/or carbon-doped silicon oxide.

The size, thickness, shape, layer structure, and the like of the substrate are not particularly limited, and can be appropriately selected as desired.

As described above, the object to be treated used in the treatment method according to an embodiment of the present invention has a metal-containing substance on a substrate.

The method for manufacturing the substrate having the metal-containing substance is not particularly limited. For example, a metal-containing film can be formed on the substrate by a sputtering method, a chemical vapor deposition (CVD) method, a molecular beam epitaxy (MBE) method, or the like. In a case where the metal-containing film is formed by a sputtering method, a CVD method, or the like, sometimes the metal-containing substance is also attached to the back surface of the substrate having the metal-containing film (the surface opposite to the side of the metal-containing film).

Furthermore, a metal-containing wiring line may be formed on the substrate by performing the aforementioned method through a predetermined mask.

In addition, after the metal-containing film or the metal-containing wiring line is formed on the substrate, the substrate may be further subjected to a different process or treatment and then used as the object to be treated by the treatment method.

For example, by performing dry etching on the substrate having a metal-containing film or metal-containing wiring line, a substrate having dry etching residues containing a metal may be manufactured. Furthermore, by performing CMP on the substrate having a metal-containing film or metal-containing wiring line, a substrate having a metal-containing substance may be manufactured.

[Method for Treating Substrate]

The method for treating a substrate according to an embodiment of the present invention (hereinafter, also called "present treatment method") includes a step A of removing metal-containing substances on a substrate by using the composition described above.

As described above, particularly, in a case where the metal-containing substances include a Ru-containing substance, the present treatment method is suitably used.

The composition used in the present treatment method is as described above.

In addition, the substrate having metal-containing substances, which is an object to be treated by the present treatment method, is as described above.

Examples of specific methods of the step A include a method of bringing the substrate having metal-containing substances, which is an object to be treated, into contact with the composition.

The method of bringing the substrate into contact with the composition is not particularly limited, and examples thereof include a method of immersing the object to be treated in the composition put in a tank, a method of spraying the composition onto the substrate, a method of irrigating the substrate with the composition, and any combination of these. Among these, the method of immersing the substrate having metal-containing substances, which is an object to be treated, in the composition is preferable.

In order to further enhance the cleaning ability of the composition, a mechanical stirring method may also be used.

Examples of the mechanical stirring method include a method of circulating the composition on a substrate, a method of irrigating the substrate with the composition or spraying the composition onto the substrate, a method of stirring the composition by using ultrasonic or megasonic waves, and the like.

The treatment time of the step A can be adjusted according to the method of bringing the composition into contact with the substrate, the temperature of the composition, and the like. The treatment time (the contact time between the composition and the object to be treated) is not particularly limited, and is preferably 0.25 to 10 minutes, and more preferably 0.5 to 2 minutes.

The temperature of the composition during the treatment is not particularly limited, and is preferably 20° C. to 75° C. and more preferably 20° C. to 60° C.

In the step A, only one kind of metal-containing substance or two or more kinds of metal-containing substances may be removed from the substrate.

In a case where two or more kinds of metal-containing substances are removed by the step A, the two or more kinds of metal-containing substances may be removed simultaneously by a single treatment or may be separately treated. The composition is preferably used in a removal treatment performed to remove at least one metal-containing substance in the step A of removing two or more kinds of metal-containing substances on the substrate by a plurality of removal treatments.

Examples of the combination of two or more kinds of metal-containing substances include a combination of substances containing two or more kinds of metals among the metals M described above (two or more kinds of metal M-containing substances). Among these, a combination of at least a Ru-containing substance and a Cu-containing substance or a Co-containing substance is preferable.

In the step A, a treatment may be performed in which while the content of a periodic acid compound, an azole compound, and/or an alkali compound in the composition is being measured, if necessary, a solvent (preferably water) is added to the composition. In a case where this treatment is performed, the content of components in the composition can be stably maintained in a predetermined range.

Examples of the method for measuring the content of a periodic acid compound, an azole compound, an alkali compound, and optional components in the composition include ion chromatography. Specifically, examples of the device include Dionex ICS-2100 manufactured by Thermo Fisher Scientific Inc.

Specifically, examples of suitable aspects of the step A include a step A1 of performing a recess etching treatment on a metal-containing wiring line disposed on a substrate by using the composition, a step A2 of removing a metal-containing film on an outer edge portion of a substrate, on which the metal-containing film is disposed, by using the composition, a step A3 of removing a metal-containing substance attached to a back surface of a substrate, on which a metal-containing film is disposed, by using the composition, a step A4 of removing a metal-containing substance on a substrate, which has undergone dry etching, by using the composition, and a step A5 of removing a metal-containing substance on a substrate, which has undergone a chemical mechanical polishing treatment, by using the composition.

Among these, the step A1 is more preferable as the step A.

Hereinafter, the present treatment method used in each of the above treatments will be described.

<Step A1>

Examples of the step A include a step A1 of performing a recess etching treatment on a metal-containing wiring line disposed on a substrate by using the composition.

FIG. 1 is a schematic cross-sectional top view showing an example of a substrate having a metal-containing wiring line (hereinafter, also called "wiring board") which is an object to be treated by the recess etching treatment in the step A1.

A wiring board 10a shown in FIG. 1 has a substrate not shown in the drawing, an insulating film 12 having a groove disposed on the substrate, a barrier metal layer 14 disposed along the inner wall of the groove, and a metal-containing wiring line 16 that fills up the inside of the groove.

The substrate and the metal-containing wiring line in the wiring board are as described above.

As the metal-containing wiring line, a Ru-containing wiring line (wiring line that contains Ru), a Cu-containing wiring line, or a Co-containing wiring line is preferable. It is preferable that the Ru-containing wiring line contain simple Ru, an alloy of Ru, an oxide of Ru, a nitride of Ru, or an oxynitride of Ru.

The material constituting the barrier metal layer in the wiring board is not particularly limited, and examples thereof include titanium nitride (TiN) and tantalum nitride (TaN).

In FIG. 1, an aspect is illustrated in which the wiring board has a barrier metal layer. However, the wiring board may not have the barrier metal layer.

Although FIG. 1 does not show a liner layer, a liner layer may be disposed between the barrier metal layer 14 and the metal-containing wiring line 16. The material constituting the liner layer is not particularly limited, and examples thereof include a Ru-containing substance, a Cu-containing substance, and a Co-containing substance.

The method for manufacturing the wiring board is not particularly limited, and examples thereof include a method including a step of forming an insulating film on a substrate, a step of forming a groove in the insulating film, a step of forming a barrier metal layer on the insulating film, a step of forming a metal-containing film that fills up the groove, and a step of performing a planarizing treatment on the metal-containing film.

In the step A1, a recess etching treatment is performed on the metal-containing wiring line in the wiring board by using the aforementioned composition, so that a portion of the metal-containing wiring line can be removed, and a recess portion can be formed.

Figure 2:
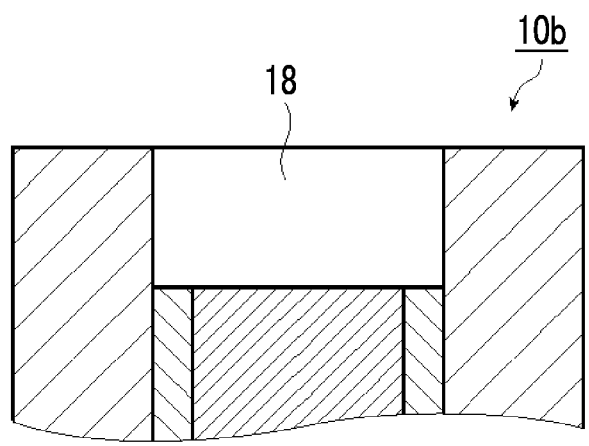
FIG. 2 is a schematic cross-sectional top view showing an example of an object to be treated having undergone the step A1.

More specifically, in a case where the step A1 is performed, as shown in a wiring board 10b in FIG. 2, a portion of the barrier metal layer 14 and the metal-containing wiring line 16 is removed, and a recess portion 18 is formed.

Examples of specific methods of the step A1 include a method of bringing the wiring board into contact with the composition.

The method of bringing the wiring board into contact with the composition is as described above.

The suitable ranges of the contact time between the composition and the wiring board and the temperature of the composition are as described above.

(Steps A1a and A1b)

It is also preferable to perform a step A1a and a step A1b as the step A1, the step A1a being a step of removing at least one metal-containing substance among two or more kinds of metal-containing substances disposed on a substrate (for example, a combination of two or more kinds of metal M-containing substances, preferably, a combination of a Ru-containing substance and a Cu-containing substance or a Co-containing substance) and the step A1b being a step of removing a metal-containing substance different from the metal-containing substance removed by the step A1a.

The steps A1a and A1b are performed, for example, on a wiring board in which a liner layer is disposed between a metal-containing wiring line and a barrier metal layer that are different metal-containing substances.

In a case where the metal-containing wiring line and the liner layer are composed of different metal-containing substances, sometimes the component constituting the metal-containing wiring line and the component constituting the liner layer exhibit different solubility in a treatment solution depending on the type of components. In such a case, it is preferable to perform the step A1a of removing the metal-containing wiring line by using a solution A that dissolves better the metal-containing wiring line than the liner layer and to perform the step A1b of removing the liner layer by using a solution B that dissolves better the liner layer than the metal-containing wiring line. Performing the two-step removal treatment consisting of the steps A1a and A1b makes it possible to finely adjust to what extent the metal-containing wiring line and the liner layer will be removed and to ensure the in-plane uniformity of a wafer.

The wiring board comprising the metal-containing wiring line and the liner layer is preferably a combination of a Cu-containing wiring line or a Co-containing wiring line as the metal-containing wiring line and a Ru-containing wiring line as the liner layer or a combination of a Ru-containing wiring line as the metal-containing wiring line and a Cu-containing substance or a Co-containing substance as the liner layer, and more preferably a combination of a Cu-containing wiring line or a Co-containing wiring line as the metal-containing wiring line and a Ru-containing substance as the liner layer.

The present composition exhibits high etching selectivity for a Ru-containing substance relative to a Cu-containing substance and a Co-containing substance. Therefore, in a case where the metal-containing wiring line is a Ru-containing wiring line and the liner layer is a Cu-containing substance or a Co-containing substance, it is preferable to use the present composition as the solution A used in the step A1a of removing the metal-containing wiring line. Furthermore, in a case where the metal-containing wiring line is a Cu-containing wiring line or a Co-containing wiring line and the liner layer is a Ru-containing substance, it is preferable to use the present composition as the solution B used in the step A1b of removing the liner layer.

The present composition exhibits particularly high etching selectivity for a material (preferably TiN or TaN) constituting a barrier metal layer. Therefore, for a wiring board comprising a liner layer between a metal-containing wiring line and a barrier metal layer, it is more preferable to use the present composition as the solution B used in the step A1b of removing the liner layer in contact with the barrier metal layer.

In a case where the steps A1a and A1b are performed as the step A1, one of the solutions A and B is the present composition, and the other is a solution other than the present composition. The solution other than the present composition that can be used as the solution A or B in the step A1a or A1b is not particularly limited. Depending on the type of two or more kinds of metal-containing substances disposed on a substrate, the etching selectivity of the present composition, and the like, known solvents can be used.

For instance, in a case where the step A1b of removing a liner layer by using the present composition is to be performed on a wiring board having a Cu-containing wiring line or a Co-containing wiring line as a metal-containing wiring line and a Ru-containing substance as a liner layer, examples of the solution other than the present composition that can be used in the step A1a of removing a metal-containing wiring line include a mixed solution of sulfuric acid and hydrogen peroxide water (SPM), a mixed solution of aqueous ammonia and hydrogen peroxide water (SC-1 or APM), hydrogen peroxide water and aqueous acidic solution repeatedly used for the treatment, and the like.

In the present treatment method, the step A1a and the step A1b may be alternately performed.

In a case where the steps A1a and A1b are alternately performed, it is preferable that each of the step A1a and the step A1b be performed 1 to 10 times.

(Step B)

Before or after the step A1, if necessary, a step B of treating the wiring board by using a predetermined solution (hereinafter, also called "specific solution") may be performed.

Particularly, as described above, in a case where a barrier metal layer is disposed on the substrate, sometimes the component constituting the metal-containing wiring line and the component constituting the barrier metal layer exhibit different solubility in the present composition depending on the type of the components. In this case, it is preferable to adjust to what extent the metal-containing wiring line and the barrier metal layer will dissolve by using a solution that dissolves better the barrier metal layer.

In this respect, as the specific solution, a solution is preferable which poorly dissolves the metal-containing wiring line but excellently dissolves the substance constituting the barrier metal layer.

Examples of the specific solution include a solution selected from the group consisting of a mixed solution of hydrofluoric acid and hydrogen peroxide water (FPM), a mixed solution of sulfuric acid and hydrogen peroxide water (SPM), a mixed solution of aqueous ammonia and hydrogen peroxide water (APM), and a mixed solution of hydrochloric acid and hydrogen peroxide water (HPM).

The composition of FPM is, for example, preferably in a range of "hydrofluoric acid:hydrogen peroxide water:water=1:1:1" to "hydrofluoric acid:hydrogen peroxide water:water=1:1:200" (volume ratio).

The composition of SPM is, for example, preferably in a range of "sulfuric acid:hydrogen peroxide water:water=3:1:0" to "sulfuric acid:hydrogen peroxide water:water=1:1:10" (volume ratio).

The composition of APM is, for example, preferably in a range of "aqueous ammonia:hydrogen peroxide water:water=1:1:1" to "aqueous ammonia:hydrogen peroxide water:water=1:1:30" (volume ratio).

The composition of HPM is, for example, preferably in a range of "hydrochloric acid:hydrogen peroxide water:water=1:1:1" to "hydrochloric acid:hydrogen peroxide water:water=1:1:30" (volume ratio).

The preferred compositional ratio described above means a compositional ratio determined in a case where the hydrofluoric acid is 49% by mass hydrofluoric acid, the sulfuric acid is 98% by mass sulfuric acid, the aqueous ammonia is 28% by mass aqueous ammonia, the hydrochloric acid is 37% by mass hydrochloric acid, and the hydrogen peroxide water is 31% by mass hydrogen peroxide water.

In the step B, as the method of treating the substrate obtained by the step A1 by using the specific solution, a method of bringing the substrate obtained by the step A1 into contact with the specific solution is preferable.

The method of bringing the substrate obtained by the step A1 into contact with the specific solution is not particularly limited, and examples thereof include the same method as the method of bringing the substrate into contact with the composition.

The contact time between the specific solution and the substrate obtained by the step A1 is, for example, preferably 0.25 to 10 minutes, and more preferably 0.5 to 5 minutes.

In the present treatment method, the step A1 and the step B may be alternately performed.

In a case where the steps are alternately performed, it is preferable that each of the step A1 and the step B is performed 1 to 10 times.

In a case where the step A1 includes the steps A1a and A1b, the step B may be performed before the steps A1a and A1b or after the steps A1a and A1b. Furthermore, the step A1 that consists of the steps A1a and A1b and the step B may be alternately performed.

<Step A2>

Examples of the step A include a step A2 of removing a metal-containing film at the outer edge portion of a substrate, on which the metal-containing film is disposed, by using the composition.

Figure 3:
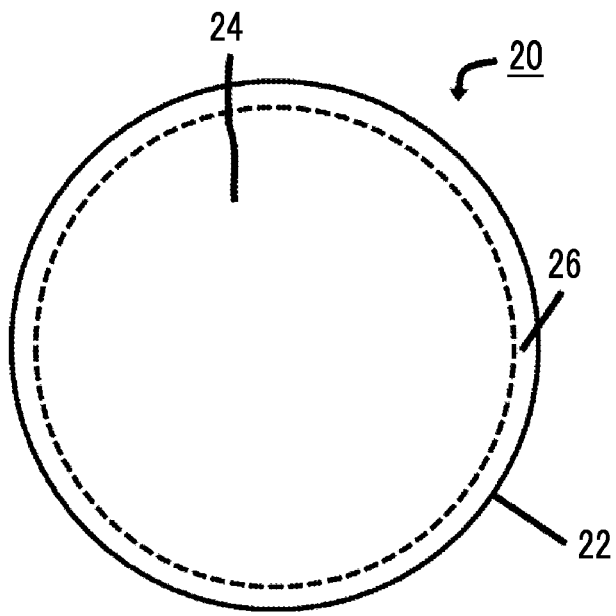
FIG. 3 is a schematic view showing an example of an object to be treated used in a step A2.

FIG. 3 is a schematic view (top view) showing an example of a substrate, on which a metal-containing film is disposed, as an object to be treated by the step A2.

An object 20 to be treated by the step A2 shown in FIG. 3 is a laminate having a substrate 22 and a metal-containing film 24 disposed on one main surface (entire region surrounded by the solid line) of the substrate 22. As will be described later, in step A2, the metal-containing film 24 positioned at an outer edge portion 26 (the region outside the broken line) of the object 20 to be treated is removed.

The substrate and the metal-containing film in the object to be treated are as described above.

As the metal-containing film, a Ru-containing film (film containing Ru) is preferable. It is preferable that the Ru-containing film contain simple Ru, an alloy of Ru, an oxide of Ru, a nitride of Ru, or an oxynitride of Ru.

The specific method of the step A2 is not particularly limited, and examples thereof include a method of supplying the composition from a nozzle such that the composition comes into contact with only the metal-containing film at the outer edge portion of the substrate.

During the treatment of the step A2, it is possible to preferably use the substrate treatment device and the substrate treatment method described in JP2010-267690A, JP2008-080288A, JP2006-100368A, and JP2002-299305A.

The method of bringing the object to be treated into contact with the composition is as described above.

The suitable ranges of the contact time between the composition and the object to be treated and the temperature of the composition are as described above.

<Step A3>

Examples of the step A include a step A3 of removing a metal-containing substance attached to the back surface of a substrate, on which a metal-containing film is disposed, by using the composition.

Examples of the object to be treated by the step A3 include the object to be treated used in the step A2. At the time of forming the object to be treated, which is constituted with a substrate and a metal-containing film disposed on one main surface of the substrate, used in the step A2, the metal-containing film is formed by sputtering, CVD, or the like. At this time, sometimes a metal-containing substance is attached to a surface (back surface) of the substrate that is opposite to the metal-containing film. The step A3 is performed to remove such a metal-containing substance in the object to be treated.

The specific method of the step A3 is not particularly limited, and examples thereof include a method of spraying the composition such that the composition comes into contact with only the back surface of the substrate.

The method of bringing the object to be treated into contact with the composition is as described above.

The suitable ranges of the contact time between the composition and the object to be treated and the temperature of the composition are as described above.

<Step A4>

Examples of the step A include a step A4 of removing a metal-containing substance on a substrate, which has undergone dry etching, by using the composition.

Figure 4:
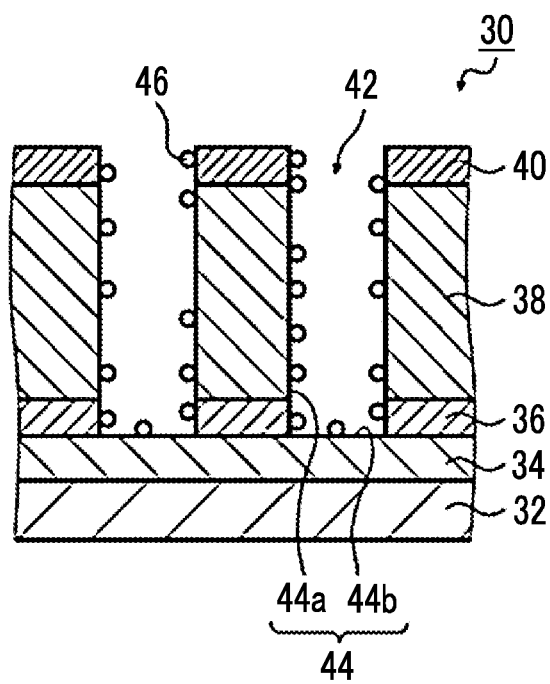
FIG. 4 is a schematic cross-sectional view showing an example of an object to be treated used in a step A4.

FIG. 4 is a schematic view showing an example of the object to be treated by the step A4.

An object 30 to be treated shown in FIG. 4 comprises a metal-containing film 34, an etching stop layer 36, an interlayer insulating film 38, a metal hard mask 40 in this order on a substrate 32. Through a dry etching process or the like, a hole 42 exposing the metal-containing film 34 is formed at a predetermined position. That is, the object to be treated shown in FIG. 4 is a laminate which comprises the substrate 32, the metal-containing film 34, the etching stop layer 36, the interlayer insulating film 38, and the metal hard mask 40 in this order and comprises the hole 42 that extends from the surface of the metal hard mask 40 to the surface of the metal-containing film 34 at the position of the opening portion of the mask 40. An inner wall 44 of the hole 42 is constituted with a cross-sectional wall 44a which consists of the etching stop layer 36, the interlayer insulating film 38, and the metal hard mask 40, and a bottom wall 44b which consists of the exposed metal-containing film 34. A dry etching residue 46 is attached to the inner wall 44.

The dry etching residue includes a metal-containing substance.

As the metal-containing film, a Ru-containing film (film containing Ru) is preferable. It is preferable that the Ru-containing film contain simple Ru, an alloy of Ru, an oxide of Ru, a nitride of Ru, or an oxynitride of Ru.

As the metal-containing substance, a Ru-containing substance is preferable. It is preferable that the Ru-containing substance contain simple Ru, an alloy of Ru, an oxide of Ru, a nitride of Ru, or an oxynitride of Ru.

As the interlayer insulating film and the metal hard mask, known materials are selected.

Although FIG. 4 describes an aspect in which a metal hard mask is used, a resist mask formed of a known photoresist material may also be used.

Examples of the specific method of the step A4 include a method of bringing the aforementioned object to be treated into contact with the composition.

The method of bringing the wiring board into contact with the composition is as described above.

The suitable ranges of the contact time between the composition and the wiring board and the temperature of the composition are as described above.

<Step A5>

Examples of the step A include a step A5 of removing a metal-containing substance on a substrate, which has undergone chemical mechanical polishing (CMP), by using the composition.

The CMP technique is used for planarizing an insulating film, planarizing connection holes, and a manufacturing process of a damascene wiring line and the like. In some cases, a substrate having undergone CMP is contaminated with a large amount of particles used as abrasive particles, metal impurities, and the like. Therefore, it is necessary to remove these contaminants and wash the substrate before the next processing stage starts. Performing the step A5 makes it possible to remove a metal-containing substance which is generated in a case where the object to be treated by CMP has a metal-containing wiring line or a metal-containing film and attached onto the substrate.

As described above, examples of the object to be treated by the step A5 include a substrate having undergone CMP that has a metal-containing substance.

As the metal-containing substance, a Ru-containing substance is preferable. It is preferable that the Ru-containing substance contain simple Ru, an alloy of Ru, an oxide of Ru, a nitride of Ru, or an oxynitride of Ru.

Examples of the specific method of the step A5 include a method of bringing the aforementioned object to be treated into contact with the composition.

The method of bringing the wiring board into contact with the composition is as described above.

The suitable ranges of the contact time between the composition and the wiring board and the temperature of the composition are as described above.

<Step C>

If necessary, the present treatment step may have a step C of performing a rinsing treatment on the substrate obtained by the step A by using a rinsing liquid after the step A.

In a case where the substrate is brought into contact with the present composition, sometimes an iodine compound derived from the present composition is attached to the surface of the substrate as residual iodine (I residue). Such residual iodine (I residue) may negatively affect the subsequent processes and/or end products. Performing the rinsing step makes it possible to remove the residual iodine (I residue) from the surface of the substrate.

As the rinsing liquid, for example, hydrofluoric acid, hydrochloric acid, hydrogen peroxide water, a mixed solution of hydrofluoric acid and hydrogen peroxide water, a mixed solution of sulfuric acid and hydrogen peroxide water, a mixed solution of aqueous ammonia and hydrogen peroxide water, a mixed solution of hydrochloric acid and hydrogen peroxide water, aqueous carbon dioxide, ozonated water, aqueous hydrogen, an aqueous citric acid solution, sulfuric acid, aqueous ammonia, isopropyl alcohol, an aqueous hypochlorous acid solution, aqua regia, ultrapure water, nitric acid, perchloric acid, an aqueous oxalic acid solution, or an aqueous orthoperiodic acid solution is preferable. As long as the purpose of the rinsing step is not impaired, these rinsing liquids may be used by being mixed together.

The hydrofluoric acid, nitric acid, perchloric acid, and hydrochloric acid mean aqueous solutions obtained by dissolving HF, $HNO_3$, $HClO_4$, and HCl in water respectively.

The sulfuric acid may be an aqueous solution obtained by dissolving $H_2SO_4$ in water.

The ozonated water, aqueous carbon dioxide, and aqueous hydrogen mean aqueous solutions obtained by dissolving $O_3$, $CO_2$, and $H_2$ in water respectively.

Among the above, as the rinsing liquid, in view of further reducing iodine remaining on the surface of the substrate after the rinsing step, aqueous carbon dioxide, ozonated water, aqueous hydrogen, hydrofluoric acid, an aqueous citric acid solution, hydrochloric acid, sulfuric acid, aqueous ammonia, hydrogen peroxide water, SPM, APM, HPM, IPA, an aqueous hypochlorous acid solution, aqua regia, or FPM is preferable, and hydrofluoric acid, hydrochloric acid, hydrogen peroxide water, SPM, APM, HPM, or FPM is more preferable.

Examples of the specific method of the step C include a method of bringing the substrate as an object to be treated obtained by the step A into contact with the rinsing liquid.

The method of bringing the substrate into contact with the rinsing liquid is performed by immersing the substrate in the rinsing liquid put in a tank, spraying the rinsing liquid onto the substrate, irrigating the substrate with the rinsing liquid, or any combination of these.

The treatment time (contact time between the rinsing liquid and the object to be treated) is not particularly limited, and may be 5 seconds or more and 5 minutes or less.

The temperature of the rinsing liquid during the treatment is not particularly limited, and is preferably 16° C. to 60° C., and more preferably 18° C. to 40° C.

If necessary, the present treatment method may have a step D of performing a drying treatment after the step C. The method of the drying treatment is not particularly limited, and examples thereof include spin drying, placing the substrate under a drying gas stream, heating the substrate by a heating unit such as a hot plate or an infrared lamp, isopropyl alcohol (IPA) vapor drying, Marangoni drying, Rotagoni drying, and any combination of these.

The drying time varies with the specific method to be used, but is about 30 seconds or more and a few minutes or less in general.

The present treatment method may be performed in combination before or after other steps performed on a substrate. While being performed, the present treatment method may be incorporated into those other steps. Alternatively, while those other steps are being performed, the present treatment method may be incorporated into the steps and performed.

Examples of those other steps include a step of forming each structure such as metal wiring, a gate structure, a source structure, a drain structure, an insulating layer, a ferromagnetic layer and/or a nonmagnetic layer (layer formation, etching, chemical mechanical polishing, modification, and the like), a step of forming resist, an exposure step and a removing step, a heat treatment step, a washing step, an inspection step, and the like.

The present treatment method may be performed in the back end process (BEOL: Back end of the line) or in the front end process (FEOL: Front end of the line). However, from the viewpoint of enabling the effects of the present invention to be further demonstrated, it is preferable to perform the present treatment method in the front end process.

EXAMPLES

Hereinafter, the present invention will be more specifically described based on examples. The materials, the amounts and ratios of the materials used, the details of treatments, the procedures of treatments, and the like shown in the following examples can be appropriately changed as long as the gist of the present invention is maintained. Therefore, the scope of the present invention is not restricted by the following examples.

Example A

[Preparation of Composition]

The compositions having the makeups shown in the following Tables 1 to 3 were prepared, and the prepared compositions were tested as below.

Hereinbelow, the meaning of abbreviations used in Tables 1 to 3 for the oxidant (periodic acid compound), azole compound, water-soluble organic solvent, surfactant, organic acid, and alkali compound used for preparing the compositions will be described.

All of the following components used for preparing the compositions were obtained from the market.

(Oxidant (O))
O1: Orthoperiodic acid (included in periodic acid compound)
O2: Metaperiodic acid (included in periodic acid compound)
O3: Hydrogen peroxide (not included in periodic acid compound)
O4: Iodic acid (not included in periodic acid compound)
(Azole Compound (A))
A1: 1H-benzotriazole
A2: 5-Methyl-1H-benzotriazole
A3: Tolyl triltriazole
A4: 2,2'-{[(5-methyl-1H-benzotriazol-1-yl)methyl]imino} diethanol
A5: 1,2,4-Triazole
A6: Adenine
A7: Guanine (Water-Soluble Organic Solvent (B))
B1: Diethylene glycol diethyl ether
B2: Tetraethylene glycol dimethyl ether
B3: Diethylene glycol dibutyl ether
B4: Diethylene glycol monobutyl ether
(Surfactant (C))
C1: Betaine lauryldimethylaminoacetate
C2: Betaine stearyldimethylaminoacetate
C3: 2-Lauryl-N-carboxymethyl-N-hydroxyethyl imidazolinium betaine
C4: Dodecylbenzenesulfonic acid
C5: Lauryl phosphate ester ("PHOSTEN HLP" manufactured by Nikko Chemicals Co., Ltd.)
C6: $C_{12}$~$C_{14}$ Alkyldiphenyl ether disulfonic acid ("TAKESURF A43-NQ" manufactured by TAKEMOTO OIL & FAT Co., Ltd.)
C7: $(CH_3)_2Ph\text{-}(OE)_6OPO_3H_2$: TOHO Chemical Industry Co., Ltd., trade name "PHOSPHANOL FS-3PG"
(Organic Acid (D))
D1: Citric acid
D2: Tartaric acid
D3: Acetic acid
D4: 1-Hydroxyethylidene-1,1-diphosphonic acid (HEDP)
D5: Diethylenetriaminepentaacetic acid (DTPA)
D6: Succinic acid
D7: Adipic acid
(Alkali Compound (E))
E1: Tetramethylammonium hydroxide
E2: Ethyltrimethylammonium hydroxide
E3: Tetraethylammonium hydroxide
E4: Tetrabutylphosphonium hydroxide (TBPH)
E5: 2-Amino-2-methyl-1-propanol (AMP)
E6: 2-(Dimethylamino)-2-methyl-1-propanol (DMAMP)
In Comparative Example 1, citric acid (D1) was used instead of the alkali compound.
(Additive (F))
F1: γ-cyclodextrin (γ-CD)
F2: Polyacrylic acid (weight-average molecular weight (Mw): 6,000)
F3: Polyacrylic acid (weight-average molecular weight (Mw): 30,000)

The column of "Amount" in Tables 1 to 3 shows the content of each component with respect to the total mass of the composition.

In each of examples and comparative examples, the content of the alkali compound (citric acid in Comparative Example 1) was adjusted so that the composition had the pH shown in the column of "pH of Composition" in Tables 1 to 3.

Furthermore, in Examples A22 to A38, A40 to A58, A60, and A61, the contents of two kinds of alkali compounds were adjusted so that the content ratio of the alkali compounds was 1:1 as a mass ratio. In Examples A39 and A59, the contents of three kinds of alkali compounds were adjusted so that the content ratio of the alkali compounds was 1:1:1 as a mass ratio.

The remainder of the composition is water.

In the table, the numerical value in the column of "Ratio 1 (O/A)" represents the ratio (mass ratio) of the content of the oxidant (periodic acid) to the content of the azole compound, the numerical value in the column of "Ratio 2 (B/A)" represents the ratio (mass ratio) of the content of the water-soluble organic solvent to the content of the azole compound in a case where the water-soluble organic solvent is used, and the numerical value in the column of "Ratio 3

(O/E)" represents the ratio (mass ratio) of the content of the oxidant (periodic acid) to the content of the alkali compound.

[Test]

Substrates were prepared in which a Ru layer (layer composed of simple Ru) was formed on one surface of a commercial silicon wafer (diameter: 12 inches) by a chemical vapor deposition (CVD) method.

Each of the obtained substrates was put in a container filled with the composition of each of the examples or comparative examples, and the composition was stirred to perform a Ru layer removal treatment. The temperature of the composition was the temperature (° C.) described in the column of "Treatment temperature" in the table.

[Evaluation]

<Ru Dissolving Ability>

The etching rate (Å/min) of the Ru layer was calculated from the difference in the thickness of the Ru layer before and after the treatment. The calculated etching rate of the Ru layer was evaluated according to the following standard. The evaluation results are shown in Tables 1 to 3.

AA: Etching rate is 30 Å/min or more.
A: Etching rate is 20 Å/min or more and less than 30 Å/min.
B: Etching rate is 10 Å/min or more and less than 20 Å/min.
C: Etching rate is 5 Å/min or more and less than 10 Å/min.
D: Etching rate is less than 5 Å/min.

<Etching Selectivity>

Substrates were prepared according to the same method as above, except that a Cu layer, a TaN layer, or a Co layer was formed instead of the Ru layer by the CVD method. The etching rate (Å/min) of each of the Cu layer, the TaN layer, and the Co layer was calculated.

From the calculated etching rates of the Ru layer, the Cu layer, the TaN layer, and the Co layer, the ratio of the etching rate of the Ru layer to the etching rate of the Cu layer, the TaN layer, or the Co layer (etching selection ratio) was calculated for each composition. Based on the etching selection ratio of the Ru layer to the Cu layer (Ru/Cu), the etching selection ratio of the Ru layer to the TaN layer (Ru/TaN), and the etching selection ratio of the Ru layer to the Co layer (Ru/Co), the etching selectivity was evaluated based on the following standard. The evaluation results are shown in Tables 1 to 3.

(Ru/Cu)
AA: The etching selection ratio of the Ru layer to the Cu layer is 100 or more.
A: The etching selection ratio of the Ru layer to the Cu layer is 50 or more and less than 100.
B: The etching selection ratio of the Ru layer to the Cu layer is 20 or more and less than 50.
C: The etching selection ratio of the Ru layer to the Cu layer is 2 or more and less than 20.
D: The etching selection ratio of the Ru layer to the Cu layer is less than 2.

(Ru/TaN)
AA: The etching selection ratio of the Ru layer to the TaN layer is 250 or more.
A: The etching selection ratio of the Ru layer to the TaN layer is 150 or more and less than 250.
B: The etching selection ratio of the Ru layer to the TaN layer is 50 or more and less than 150.
C: The etching selection ratio of the Ru layer to the TaN layer is 10 or more and less than 50.
D: The etching selection ratio of the Ru layer to the TaN layer is less than 10.

(Ru/Co)
AA: The etching selection ratio of the Ru layer to the Co layer is 60 or more.
A: The etching selection ratio of the Ru layer to the Co layer is 40 or more and less than 60.
B: The etching selection ratio of the Ru layer to the Co layer is 20 or more and less than 40.
C: The etching selection ratio of the Ru layer to the Co layer is 1 or more and less than 20.
D: The etching selection ratio of the Ru layer to the Co layer is less than 1.

The results are shown in the following tables.

TABLE 1

| Makeup of composition | | | Example A1 | Example A2 | Example A2 | Example A4 | Example A5 | Example A6 | Example A7 | Example A8 |
|---|---|---|---|---|---|---|---|---|---|---|
| | Oxidant (O) | Type | O1 | O1 | O1 | O1 | O1 | O1 | O1 | O1 |
| | | Amount (%) | 6.0 | 5.0 | 3.0 | 7.0 | 5.0 | 7.0 | 6.0 | 6.0 |
| | Azole compound (A) | Type | A1 | A2 | A3 | A1 | A2 | A3 | A1 | A1 |
| | | Amount (%) | 0.1 | 0.2 | 0.02 | 0.1 | 0.2 | 0.1 | 0.05 | 0.1 |
| | Water-soluble organic solvent (B) | Type | B1 | B2 | B1 | B2 | B1 | B2 | — | B1 |
| | | Amount (%) | 10.0 | 12.0 | 14.0 | 12.0 | 12.0 | 12.0 | — | 10.0 |
| | Surfactant (C) | Type | C1 | — | — | — | C1 | — | — | C1 |
| | | Amount (%) | 0.1 | — | — | — | 0.1 | — | — | 0.1 |
| | Organic acid (D) | Type | — | — | — | — | — | — | — | D1 |
| | | Amount (%) | — | — | — | — | — | — | — | 0.7 |
| | Alkali compound (E) | Type | E1 | E2 | E1 | E1 | E1 | E1 | E1 | E1 |
| | Water | Amount | Remainder | Remainder | Remainder | Remainder | Remainder | Remainder | Remainder | Remainder |
| Ratio 1 (O/A) | | | 60 | 25 | 150 | 70 | 25 | 70 | 120 | 60 |
| Ratio 2 (B/A) | | | 100 | 60 | 700 | 120 | 60 | 120 | — | 100 |
| Ratio 3 (O/E) | | | 1.1 | 1.3 | 1.4 | 1.1 | 1.3 | 1.3 | 1.3 | 1.3 |
| pH of composition | | | 7.0 | 8.0 | 9.0 | 7.0 | 8.0 | 8.0 | 8.0 | 8.0 |
| Treatment temperature (° C.) | | | 55 | 55 | 55 | 55 | 55 | 55 | 55 | 55 |

TABLE 1-continued

| | | | | | | | | | | |
|---|---|---|---|---|---|---|---|---|---|---|
| Evaluation of composition | Etching rate | Ru | A | B | B | AA | AA | AA | B | AA |
| | Etching selectivity | Ru/Cu | B | B | C | B | AA | B | C | AA |
| | | Ru/TaN | AA | B | B | AA | AA | AA | B | AA |
| | | Ru/Co | B | C | C | B | B | AA | C | AA |

| | | | Example A9 | Example A10 | Example A11 | Example A12 | Example A13 | Example A14 | Example A15 | Example A16 |
|---|---|---|---|---|---|---|---|---|---|---|
| Makeup of composition | Oxidant (O) | Type | O1 | O1 | O1 | O1 | O1 | O2 | O1 | O1 |
| | | Amount (%) | 6.0 | 7.0 | 7.0 | 6.0 | 7.0 | 7.0 | 6.0 | 6.0 |
| | Azole compound (A) | Type | A1 | A1 | A3 | A3 | A3 | A1 | A1 A3 | A2 |
| | | Amount (%) | 0.2 | 1.0 | 0.1 | 0.1 | 0.1 | 0.1 | 0.1 0.1 | 0.1 |
| | Water-soluble organic solvent (B) | Type | B1 | B2 | B2 | B2 | B2 | B1 | B1 | B1 B3 |
| | | Amount (%) | 14.0 | 12.0 | 20.0 | 10.0 | 20.0 | 5.0 | 10.0 | 9.0 1.0 |
| | Surfactant (C) | Type | C1 | — | — | — | — | — | — | — |
| | | Amount (%) | 0.2 | — | — | — | — | — | — | — |
| | Organic acid (D) | Type | D2 | — | — | — | — | — | — | — |
| | | Amount (%) | 0.7 | — | — | — | — | — | — | — |
| | Alkali compound (E) | Type | E1 | E1 | E1 | E1 | E1 | E1 | E3 | E3 |
| | Water | Amount | Remainder | Remainder | Remainder | Remainder | Remainder | Remainder | Remainder | Remainder |
| | Ratio 1 (O/A) | | 30 | 7 | 70 | 60 | 70 | 70 | 60 | 60 |
| | Ratio 2 (B/A) | | 70 | 12 | 200 | 100 | 200 | 50 | 100 | 100 |
| | Ratio 3 (O/E) | | 1.3 | 1.1 | 1.2 | 1.8 | 1.0 | 1.3 | 1.4 | 1.4 |
| | pH of composition | | 8.0 | 7.0 | 8.0 | 12.0 | 6.0 | 8.0 | 9.0 | 8.0 |
| | Treatment temperature (° C.) | | 55 | 55 | 55 | 55 | 55 | 55 | 55 | 55 |
| Evaluation of composition | Etching rate | Ru | A | C | B | AA | B | A | AA | A |
| | Etching selectivity | Ru/Cu | AA | C | C | B | C | C | AA | A |
| | | Ru/TaN | AA | B | B | B | B | A | A | B |
| | | Ru/Co | AA | C | B | B | C | C | A | B |

| | | | Example A17 | Example A18 | Example A19 | Example A20 | Example A21 | Comparative Example A1 | Comparative Example A2 | Comparative Example A3 |
|---|---|---|---|---|---|---|---|---|---|---|
| Makeup of composition | Oxidant (O) | Type | O1 | O1 | O1 | O1 | O1 | O1 | O1 | O3 |
| | | Amount (%) | 4.0 | 5.0 | 6.0 | 5.0 | 6.0 | 6.0 | 6.0 | 10.0 |
| | Azole compound (A) | Type | A1 | A1 | A1 | A1 | A1 | — | A1 | A1 |
| | | Amount (%) | 0.05 | 0.1 | 0.1 | 0.1 | 0.1 | — | 0.1 | 0.1 |
| | Water-soluble organic solvent (B) | Type | B2 | B4 | B2 | B2 | B1 | — | — | B1 |
| | | Amount (%) | 10.0 | 10.0 | 10.0 | 10.0 | 10.0 | — | — | 10.0 |
| | Surfactant (C) | Type | — | — | C2 | C3 | C4 | — | — | — |
| | | Amount (%) | — | — | 0.1 | 0.1 | 0.1 | — | — | — |
| | Organic acid (D) | Type | D3 | — | — | — | — | — | — | — |
| | | Amount (%) | 0.5 | — | — | — | — | — | — | — |
| | Alkali compound (E) | Type | E1 | E1 | E1 | E1 | E3 | D1 | — | E1 |
| | Water | Amount | Remainder | Remainder | Remainder | Remainder | Remainder | Remainder | Remainder | Remainder |
| | Ratio 1 (O/A) | | 80 | 50 | 60 | 50 | 60 | — | 60 | 100 |
| | Ratio 2 (B/A) | | 200 | 100 | 100 | 100 | 100 | — | — | 100 |
| | Ratio 3 (O/E) | | 1.4 | 1.3 | 1.3 | 1.3 | 1.5 | 1.3 | — | — |
| | pH of composition | | 9.0 | 9.0 | 8.0 | 8.0 | 9.0 | <1.0 | <1.0 | 8.0 |
| | Treatment temperature (° C.) | | 55 | 55 | 55 | 55 | 55 | 55 | 55 | 55 |
| Evaluation of composition | Etching rate | Ru | A | C | A | B | AA | AA | D | D |
| | Etching selectivity | Ru/Cu | C | A | A | A | B | D | D | D |
| | | Ru/TaN | A | B | B | A | AA | AA | D | D |
| | | Ru/Co | C | A | A | AA | C | D | D | D |

TABLE 2

| | | | Example A22 | Example A23 | Example A24 | Example A25 | Example A26 | Example A27 | Example A28 | Example A29 | Example A30 | Example A31 |
|---|---|---|---|---|---|---|---|---|---|---|---|---|
| Makeup of composition | Oxidant (O) | Type | O1 | O1 | O1 | O1 | O1 | O1 | O1 | O1 | O1 | O1 |
| | | Amount (%) | 0.5 | 0.5 | 0.5 | 0.5 | 0.5 | 0.5 | 0.5 | 0.5 | 0.5 | 0.5 |
| | | Type | — | O2 | O2 | O2 | O2 | O2 | O2 | O2 | O2 | O2 |
| | | Amount (%) | — | 0.5 | 1.0 | 3.0 | 5.0 | 5.0 | 5.0 | 5.0 | 5.0 | 5.0 |
| | Azole compound (A) | Type | A4 | A4 | A4 | A4 | A4 | A4 | A4 | A5 | A6 | A7 |
| | | Amount (%) | 2.0 | 2.0 | 2.0 | 2.0 | 2.0 | 2.0 | 2.0 | 1.0 | 1.0 | 1.0 |
| | Water-soluble organic solvent (B) | Type | — | — | — | — | — | — | — | — | — | — |
| | | Amount (%) | — | — | — | — | — | — | — | — | — | — |
| | Surfactant (C) | Type | C4 | C4 | C4 | C4 | C4 | C4 | C4 | C4 | C4 | C4 |
| | | Amount (%) | 0.5 | 0.5 | 0.5 | 0.5 | 0.5 | 0.5 | 0.5 | 0.5 | 0.5 | 0.5 |
| | Organic acid (D) | Type | D4 | D4 | D4 | D4 | D4 | D4 | D4 | D4 | D4 | D4 |
| | | Amount (%) | 0.5 | 0.5 | 0.5 | 0.5 | 0.5 | 0.5 | 0.5 | 0.5 | 0.5 | 0.5 |
| | | Type | D5 | D5 | D5 | D5 | D5 | D5 | D5 | D5 | D5 | D5 |
| | | Amount (%) | 1.0 | 1.0 | 1.0 | 1.0 | 1.0 | 1.0 | 1.0 | 1.0 | 1.0 | 1.0 |
| | Alkali compound (E) | Type | E1, E5 | E1, E5 | E1, E5 | E1, E5 | E1, E5 | E1, E5 | E1, E5 | E1, E5 | E1, E5 | E1, E5 |
| | Additive (F) | Type | F1 | F1 | F1 | F1 | F1 | F1 | F1 | F1 | F1 | F1 |
| | | Amount (%) | 1.0 | 1.0 | 1.0 | 1.0 | 1.0 | 1.0 | 1.0 | 1.0 | 1.0 | 1.0 |
| | | Type | — | — | — | — | — | F2 | F3 | — | — | — |
| | | Amount (%) | — | — | — | — | — | 1.0 | 1.0 | — | — | — |
| | Water | Amount | Remainder | Remainder | Remainder | Remainder | Remainder | Remainder | Remainder | Remainder | Remainder | Remainder |
| | Ratio 1 (O/A) | | 0.25 | 0.5 | 0.75 | 1.75 | 2.75 | 2.75 | 2.75 | 5.5 | 5.5 | 5.5 |
| | Ratio 2 (B/A) | | — | — | — | — | — | — | — | — | — | — |
| | Ratio 3 (O/E) | | 1.5 | 1.5 | 1.5 | 1.5 | 1.5 | 1.5 | 1.5 | 1.5 | 1.5 | 1.5 |
| | pH of composition | | 9.0 | 9.0 | 9.0 | 9.0 | 9.0 | 9.0 | 9.0 | 9.0 | 9.0 | 9.0 |
| | Treatment temperature (° C.) | | 23 | 23 | 23 | 23 | 23 | 23 | 23 | 23 | 23 | 23 |
| Evaluation of composition | Etching rate | Ru | A | B | B | B | B | B | B | B | B | B |
| | Etching selectivity | Ru/Cu | B | B | B | B | B | B | B | B | B | B |
| | | Ru/TaN | AA | AA | AA | AA | AA | AA | AA | AA | AA | AA |
| | | Ru/Co | B | B | B | B | B | A | A | B | B | B |

| | | | Example A32 | Example A33 | Example A34 | Example A35 | Example A36 | Example A37 | Example A38 | Example A39 | Example A40 | Example A41 |
|---|---|---|---|---|---|---|---|---|---|---|---|---|
| Makeup of composition | Oxidant (O) | Type | O1 | O1 | O1 | O1 | O1 | O1 | O1 | O1 | O1 | O1 |
| | | Amount (%) | 0.5 | 0.5 | 0.5 | 0.5 | 0.5 | 0.5 | 0.5 | 0.5 | 0.5 | 0.5 |
| | | Type | O2 | O2 | O2 | O2 | O2 | O2 | O2 | O2 | O2 | O2 |
| | | Amount (%) | 5.0 | 5.0 | 5.0 | 5.0 | 5.0 | 5.0 | 5.0 | 5.0 | 5.0 | 5.0 |
| | Azole compound (A) | Type | A4 | A4 | A4 | A4 | A4 | A4 | A4 | A4 | A4 | A4 |
| | | Amount (%) | 2.0 | 2.0 | 2.0 | 2.0 | 2.0 | 2.0 | 2.0 | 2.0 | 2.0 | 2.0 |
| | Water-soluble organic solvent (B) | Type | — | — | — | — | — | — | — | — | — | — |
| | | Amount (%) | — | — | — | — | — | — | — | — | — | — |
| | Surfactant (C) | Type | C5 | C6 | — | — | — | — | — | — | C4 | C4 |
| | | Amount (%) | 0.5 | 0.5 | — | — | — | — | — | — | 0.5 | 0.5 |
| | Organic acid (D) | Type | D4 | D4 | D4 | D6 | D7 | D6 | D6 | D6 | D4 | D4 |
| | | Amount (%) | 0.5 | 0.5 | 0.5 | 1.0 | 1.0 | 1.0 | 1.0 | 1.0 | 0.5 | 0.5 |
| | | Type | D5 | D5 | D5 | — | — | — | — | — | D5 | D5 |
| | | Amount (%) | 1.0 | 1.0 | 1.0 | — | — | — | — | — | 1.0 | 1.0 |
| | Alkali compound (E) | Type | E1, E5 | E1, E5 | E1, E5 | E1, E5 | E1, E5 | E4, E5 | E1, E6 | E1, E5, E6 | E1, E5 | E1, E5 |
| | Additive (F) | Type | F1 | F1 | F1 | F1 | F1 | F1 | F1 | F1 | F1 | F1 |
| | | Amount (%) | 1.0 | 1.0 | 1.0 | 1.0 | 1.0 | 1.0 | 1.0 | 1.0 | 1.0 | 1.0 |
| | | Type | — | — | — | — | — | — | — | — | — | — |
| | | Amount (%) | — | — | — | — | — | — | — | — | — | — |
| | Water | Amount | Remainder | Remainder | Remainder | Remainder | Remainder | Remainder | Remainder | Remainder | Remainder | Remainder |

TABLE 2-continued

|  |  |  |  |  |  |  |  |  |  |  |
|---|---|---|---|---|---|---|---|---|---|---|
| Ratio 1 (O/A) | 2.75 | 2.75 | 2.75 | 2.75 | 2.75 | 2.75 | 2.75 | 2.75 | 2.75 | 2.75 |
| Ratio 2 (B/A) | — | — | — | — | — | — | — | — | — | — |
| Ratio 3 (O/E) | 1.5 | 1.5 | 1.5 | 1.5 | 1.5 | 1.5 | 1.5 | 1.5 | 1.8 | 2.0 |
| pH of composition | 9.0 | 9.0 | 9.0 | 9.0 | 9.0 | 9.0 | 9.0 | 9.0 | 10.5 | 11.5 |
| Treatment temperature (° C.) | 23 | 23 | 23 | 23 | 23 | 23 | 23 | 23 | 23 | 23 |

| Evaluation of composition | Etching rate | Ru | B | B | B | B | B | B | B | B | B | B |
| | Etching selectivity | Ru/Cu | B | B | C | B | B | B | B | B | B | B |
| | | Ru/TaN | AA | AA | AA | AA | AA | AA | AA | AA | AA | AA |
| | | Ru/Co | B | B | B | A | A | A | A | A | A | AA |

TABLE 3

| | | | Example A42 | Example A43 | Example A44 | Example A45 | Example A46 | Example A47 | Example A48 | Example A49 | Example A50 | Example A51 |
|---|---|---|---|---|---|---|---|---|---|---|---|---|
| Makeup of composition | Oxidant (O) | Type | O2 | O1 | O1 | O1 | O1 | O1 | O1 | O1 | O1 | O1 |
| | | Amount (%) | 0.1 | 0.5 | 0.5 | 0.5 | 0.5 | 0.5 | 0.5 | 0.5 | 0.5 | 0.5 |
| | | Type | O4 | O4 | O4 | O4 | O4 | O4 | O4 | O4 | O4 | O4 |
| | | Amount (%) | 0.5 | 0.5 | 1.0 | 3.0 | 5.0 | 5.0 | 5.0 | 5.0 | 5.0 | 5.0 |
| | Azole compound (A) | Type | A4 | A4 | A4 | A4 | A4 | A4 | A4 | A5 | A6 | A7 |
| | | Amount (%) | 2.0 | 2.0 | 2.0 | 2.0 | 2.0 | 2.0 | 2.0 | 1.0 | 1.0 | 1.0 |
| | Water-soluble organic solvent (B) | Type | — | — | — | — | — | — | — | — | — | — |
| | | Amount (%) | — | — | — | — | — | — | — | — | — | — |
| | Surfactant (C) | Type | C4 | C4 | C4 | C4 | C4 | C4 | C4 | C4 | C4 | C4 |
| | | Amount (%) | 0.5 | 0.5 | 0.5 | 0.5 | 0.5 | 0.5 | 0.5 | 0.5 | 0.5 | 0.5 |
| | Organic acid (D) | Type | D4 | D4 | D4 | D4 | D4 | D4 | D4 | D4 | D4 | D4 |
| | | Amount (%) | 0.5 | 0.5 | 0.5 | 0.5 | 0.5 | 0.5 | 0.5 | 0.5 | 0.5 | 0.5 |
| | | Type | D5 | D5 | D5 | D5 | D5 | D5 | D5 | D5 | D5 | D5 |
| | | Amount (%) | 1.0 | 1.0 | 1.0 | 1.0 | 1.0 | 1.0 | 1.0 | 1.0 | 1.0 | 1.0 |
| | Alkali compound (E) | Type | E1, E5 | E1, E5 | E1, E5 | E1, E5 | E1, E5 | E1, E5 | E1, E5 | E1, E5 | E1, E5 | E1, E5 |
| | Additive (F) | Type | F1 | F1 | F1 | F1 | F1 | F1 | F1 | F1 | F1 | F1 |
| | | Amount (%) | 1.0 | 1.0 | 1.0 | 1.0 | 1.0 | 1.0 | 1.0 | 1.0 | 1.0 | 1.0 |
| | | Type | — | — | — | — | — | F2 | F3 | — | — | — |
| | | Amount (%) | — | — | — | — | — | 1.0 | 1.0 | — | — | — |
| | Water | Amount | Remainder | Remainder | Remainder | Remainder | Remainder | Remainder | Remainder | Remainder | Remainder | Remainder |
| | Ratio 1 (O/A) | | 0.3 | 0.5 | 0.75 | 1.75 | 2.75 | 2.75 | 2.75 | 5.5 | 5.5 | 5.5 |
| | Ratio 2 (B/A) | | — | — | — | — | — | — | — | — | — | — |
| | Ratio 3 (O/E) | | 1.5 | 1.5 | 1.5 | 1.5 | 1.5 | 1.5 | 1.5 | 1.5 | 1.5 | 1.5 |
| | pH of composition | | 9.0 | 9.0 | 9.0 | 9.0 | 9.0 | 9.0 | 9.0 | 9.0 | 9.0 | 9.0 |
| | Treatment temperature (° C.) | | 23 | 23 | 23 | 23 | 23 | 23 | 23 | 23 | 23 | 23 |
| Evaluation of composition | Etching rate | Ru | B | C | C | C | C | C | C | C | C | C |
| | Etching selectivity | Ru/Cu | A | A | A | A | A | A | A | A | A | A |
| | | Ru/TaN | A | AA | AA | AA | AA | AA | AA | AA | AA | AA |
| | | Ru/Co | B | B | B | B | B | A | A | B | B | B |

| | | | Example A52 | Example A53 | Example A54 | Example A55 | Example A56 | Example A57 | Example A58 | Example A59 | Example A60 | Example A61 |
|---|---|---|---|---|---|---|---|---|---|---|---|---|
| Makeup of composition | Oxidant (O) | Type | O1 | O1 | O1 | O1 | O1 | O1 | O1 | O1 | O1 | O1 |
| | | Amount (%) | 0.5 | 0.5 | 0.5 | 0.5 | 0.5 | 0.5 | 0.5 | 0.5 | 0.5 | 0.5 |
| | | Type | O4 | O4 | O4 | O4 | O4 | O4 | O4 | O4 | O4 | O4 |
| | | Amount (%) | 5.0 | 5.0 | 5.0 | 5.0 | 5.0 | 5.0 | 5.0 | 5.0 | 5.0 | 5.0 |
| | Azole compound (A) | Type | A4 | A4 | A4 | A4 | A4 | A4 | A4 | A4 | A4 | A4 |
| | | Amount (%) | 2.0 | 2.0 | 2.0 | 2.0 | 2.0 | 2.0 | 2.0 | 2.0 | 2.0 | 2.0 |
| | Water-soluble organic solvent (B) | Type | — | — | — | — | — | — | — | — | — | — |
| | | Amount (%) | — | — | — | — | — | — | — | — | — | — |
| | Surfactant (C) | Type | C5 | C6 | — | — | — | — | — | — | C4 | C4 |
| | | Amount (%) | 0.5 | 0.5 | — | — | — | — | — | — | 0.5 | 0.5 |

TABLE 3-continued

| | | | | | | | | | | | |
|---|---|---|---|---|---|---|---|---|---|---|---|
| Organic acid (D) | Type | D4 | D4 | D4 | D6 | D7 | D6 | D6 | D6 | D4 | D4 |
| | Amount (%) | 0.5 | 0.5 | 0.5 | 1.0 | 1.0 | 1.0 | 1.0 | 1.0 | 0.5 | 0.5 |
| | Type | D5 | D5 | D5 | — | — | — | — | — | D5 | D5 |
| | Amount (%) | 1.0 | 1.0 | 1.0 | — | — | — | — | — | 1.0 | 1.0 |
| Alkali compound (E) | Type | E1, E5 | E1, E5 | E1, E5 | E1, E5 | E1, E5 | E4, E5 | E1, E6 | E1, E5, E6 | E1, E5 | E1, E5 |
| Additive (F) | Type | F1 | F1 | F1 | F1 | F1 | F1 | F1 | F1 | F1 | F1 |
| | Amount (%) | 1.0 | 1.0 | 1.0 | 1.0 | 1.0 | 1.0 | 1.0 | 1.0 | 1.0 | 1.0 |
| | Type | — | — | — | — | — | — | — | — | — | — |
| | Amount (%) | — | — | — | — | — | — | — | — | — | — |
| Water | Amount | Remainder | Remainder | Remainder | Remainder | Remainder | Remainder | Remainder | Remainder | Remainder | Remainder |
| Ratio 1 (O/A) | | 2.75 | 2.75 | 2.75 | 2.75 | 2.75 | 2.75 | 2.75 | 2.75 | 2.75 | 2.75 |
| Ratio 2 (B/A) | | — | — | — | — | — | — | — | — | — | — |
| Ratio 3 (O/E) | | 1.5 | 1.5 | 1.5 | 1.5 | 1.5 | 1.5 | 1.5 | 1.5 | 1.8 | 2.0 |
| pH of composition | | 9.0 | 9.0 | 9.0 | 9.0 | 9.0 | 9.0 | 9.0 | 9.0 | 10.5 | 11.5 |
| Treatment temperature (°C.) | | 23 | 23 | 23 | 23 | 23 | 23 | 23 | 23 | 23 | 23 |
| Evaluation of composition | Etching rate Ru | C | C | C | C | C | C | C | C | C | C |
| | Etching selectivity Ru/Cu | A | A | B | A | A | A | A | A | A | A |
| | Ru/TaN | AA | AA | AA | AA | AA | AA | AA | AA | AA | AA |
| | Ru/Co | B | B | B | A | A | A | A | A | A | AA |

From the results shown in the tables, it has been confirmed that the composition according to the embodiment of the present invention has excellent dissolving ability for a Ru-containing substance and excellent etching selectivity.

Particularly, it has been confirmed that in view of higher dissolving ability and etching selectivity for metal-containing substances, the content of the azole compound is more preferably less than 1.0% by mass (comparison between Examples A4 and A8).

Particularly, it has been confirmed that in view of higher etching selectivity, the content of the azole compound is more preferably 0.08% by mass or more (comparison between Examples A4 and A17).

It has been confirmed that in order for excellent dissolving ability and excellent etching selectivity for metal-containing substances to be well balanced, the ratio of the content of the periodic acid compound to the content of the azole compound (ratio 1) is more preferably 15 to 100 as a mass ratio (comparison of Examples A2, A3, A7, A10, and A17).

It has been confirmed that in view of higher dissolving ability for metal-containing substances, the composition preferably contains a water-soluble organic solvent (comparison of Examples A1, A4, and A7).

It has been confirmed that in view of higher dissolving ability and etching selectivity for metal-containing substances, the content of the water-soluble organic solvent is preferably less than 20% by mass (comparison between Examples A6 and A11).

It has been confirmed that in view of a higher dissolving ability for metal-containing substances, the ratio of the content of the water-soluble organic solvent to the content of the azole compound (ratio 3) is more preferably 15 to 160 as a mass ratio (comparison of Examples A4, A6, A10, A11, A13, and A14).

It has been confirmed that in view of a higher dissolving ability for metal-containing substances, the water-soluble organic solvent is preferably alkylene glycol dialkyl ether (comparison of Examples A2, A4, A15, and A18).

It has been confirmed that in view of higher etching selectivity, the composition preferably contains a surfactant (comparison between Examples A2 and A5).

It has been confirmed that in view of higher etching selectivity for a Ru-containing substance relative to a Cu-containing substance and higher etching selectivity for a Ru-containing substance relative to a Co-containing substance, the composition preferably contains a carboxylic acid (comparison of Examples A8, A9, and A1).

It has been confirmed that in view of higher etching selectivity, the pH of the composition is preferably 7.0 or higher (comparison of Examples A1, A4, and A13).

A composition was prepared in the same manner as in Example A1, except that as the alkali compound (E), dimethylbis(2-hydroxyethyl)ammonium hydroxide (AH-212) (manufactured by Yokkaichi Chemical Co., Ltd.) was used instead of the tetramethylammonium hydroxide (E1). The composition was tested and evaluated in the same manner as above. As a result, the same evaluation results as in Example A1 were obtained.

A composition was prepared in the same manner as in Example A1, except that as the alkali compound (E), monoethanolamine (manufactured by FUJIFILM Wako Pure Chemical Corporation) was used instead of the tetramethylammonium hydroxide (E1). The composition was tested and evaluated in the same manner as above. As a result, the same evaluation results as in Example A1 were obtained.

A composition was prepared in the same manner as in Example A1, except that as the alkali compound (E), 2-amino-2-ethoxyethanol (manufactured by FUJIFILM Wako Pure Chemical Corporation) was used instead of the tetramethylammonium hydroxide (E1). The composition was tested and evaluated in the same manner as above. The obtained evaluation results were the same as those in Example A1, except that the evaluation result of etching selectivity of Ru/TaN was "A".

A composition was prepared in the same manner as in Example A1, except that as the alkali compound (E), sodium hydroxide (manufactured by FUJIFILM Wako Pure Chemical Corporation) was used instead of the tetramethylammonium hydroxide (E1). The composition was tested and evaluated in the same manner as above. The obtained evaluation results were the same as those in Example A1, except that the evaluation result of etching selectivity of Ru/TaN was "B".

Example B

[Preparation of Kit]

The first liquid and the second liquid having the compositions shown in the following Table 4 were prepared, and a kit of Example B1 comprising the first liquid and the second liquid was prepared.

In addition, a one-liquid type composition of Comparative Example B1 having the compositions shown in the following Table 4 was prepared. The pH of the composition of Comparative Example B1 was 8.2.

The meanings of the abbreviations used in Table 4 are the same as those in Example A. For Example B1, the column of "makeup of composition (%)" in Table 4 shows the content of each component determined in a case where the total amount of the first liquid and the second liquid is regarded as 100% by mass. For Comparative Example B1, the column shows the content of each component determined in a case where the total mass of the one-liquid type composition of Comparative Example B1 is regarded as 100% by mass.

[Test and Evaluation]

First, by using the one-liquid type composition of Comparative Example B1 immediately after manufacture, a removal treatment was performed on the Ru layer and the Cu layer according to the method described in Example A, and the etching rate (Å/min) of the Ru layer and the etching selection ratio of the Ru layer to the Cu layer (Ru/Cu) were calculated.

In Table 4, the column of "Immediately after manufacture" of "Etching rate" and "Etching selection ratio" shows the calculated etching rate (Å/min) of the Ru layer and the etching selection ratio of the Ru layer to the Cu layer (Ru/Cu).

Then, by using the first liquid and the second liquid of Example B1 and the one-liquid type composition of Comparative Example B1 as test liquids, a storage test was performed, and the storage stability of each test liquid was evaluated.

A polypropylene container having a volume of 1,000 mL was filled with 500 mL of each test liquid, and sealed. The container filled with the test liquid was stored in an environment at 50° C. for 24 hours.

The first liquid and the second liquid of Example B1 that had undergone the storage test were mixed together, thereby preparing a composition of Example B1. By using the obtained composition of Example B1, a removal treatment was performed on the Ru layer and the Cu layer according to the method described in Example A, and the etching rate (Å/min) of the Ru layer and the etching selection ratio (Ru/Cu) of the Ru layer to the Cu layer were calculated.

In addition, by using the one-liquid type composition of Comparative Example B1 that has undergone the storage test, the etching rate (Å/min) of the Ru layer and the etching selection ratio (Ru/Cu) of the Ru layer to the Cu layer were calculated as well.

By the following equations, a reduction rate of the etching rate of the Ru layer before and after the storage test and a reduction rate of the etching selection ratio (Ru/Cu) before and after the storage test were calculated.

Reduction rate of etching rate (%)=(etching rate of composition of Comparative Example B1 immediately after preparation−etching rate of composition of Example B1 prepared after storage test (or composition of Comparative Example B1 after storage test))/(etching rate of composition of Comparative Example B1 immediately after preparation)×100.

Reduction rate of etching selection ratio (%)=(etching selection ratio of composition of Comparative Example B1 immediately after preparation−etching selection ratio of composition of Example B1 prepared after storage test (or composition of Comparative Example B1 after storage test))/(etching selection ratio of composition of Comparative Example B1 immediately after preparation)×100

TABLE 4

| | | Comparative Example B1 (one-liquid type) | Example B1 (kit) First liquid | Example B1 (kit) Second liquid |
|---|---|---|---|---|
| Makeup of composition (%) | Periodic acid compound (O1) | 6.00 | 6.00 | — |
| | Azole compound (A1) | 0.10 | — | 0.10 |
| | Water-soluble organic solvent (B1) | 14.00 | — | 14.00 |
| | Surfactant (C1) | 0.20 | — | 0.20 |
| | Organic acid (D1) | 0.70 | — | 0.70 |
| | Alkali compound (E1) | 4.18 | 4.18 | — |
| | Water | 74.82 | 37.57 | 37.25 |
| | Total | 100 | 47.75 | 52.25 |
| Etching rate (Å/min) (Ru) | Immediately after manufacture | 20.3 | | |
| | After storage test | 1.0 | 19.8 | |
| | Reduction rate (%) | 95.1 | 2.5 | |
| Etching selection ratio (Ru/Cu) | Immediately after manufacture | 67.7 | | |
| | After storage test | 0.3 | 66.0 | |
| | Reduction rate (%) | 99.5 | 2.5 | |

From the results shown in the table, it has been confirmed that the kit according to the embodiment of the present invention has excellent storage stability.

Example C

[Test and Evaluation]

A stopper film and an interlayer insulating film ($SiO_2$) were formed in this order on an 8-inch silicon wafer. A wiring line groove (width: 50 nm, depth: 400 nm) was formed in the interlayer insulating film of this silicon wafer. Then, a barrier metal layer (film thickness 3 nm) consisting of a tantalum nitride (TaN) film was deposited on the entire surface of the wafer by a sputtering method. Thereafter, a liner layer (film thickness 3 nm) consisting of a ruthenium (Ru) film was deposited on the surface of the TaN film by a sputtering method. Furthermore, a Cu-containing wiring line was deposited on the surface of the liner layer until the wiring line groove was filled.

Subsequently, a CMP treatment was performed on the silicon wafer having the Cu-containing wiring line, the liner layer, and the barrier metal layer until the interlayer insulating film was exposed. The obtained patterned wafer have an interlayer insulating film having a wiring line groove, a barrier metal layer consisting of a TaN film disposed along the inner wall of the groove on a side close to the inner wall, a liner layer consisting of a Ru film that is on the barrier metal layer, and a Cu-containing wiring line that filles up the groove.

The patterned wafer was immersed in a glass container filled with an aqueous hydrogen peroxide solution (concentration 3% by mass, solution A) at 23° C. for 30 seconds, and then immersed in a glass container filled with hydrochloric acid (concentration 1% by mass, solution A) at 23° C. for 30 seconds. The immersion in the aqueous hydrogen peroxide solution and the immersion in hydrochloric acid were repeated a total of three times to carry out a removal treatment for the Cu-containing wiring line (step A1a described above). By this removal treatment, the thickness of the Cu-containing wiring line was reduced by 10 nm.

Then, the obtained patterned wafer was immersed in a glass container filled with the composition (solution B) of Example A8 for 180 seconds to carry out a removal treatment for the liner layer consisting of the Ru film that was exposed on the surface due to the removal of the Cu-containing wiring line (step A1b described above). During this treatment, the temperature of the composition (solution B) of Example A8 was 60° C.

The treated patterned wafer was observed with a transmission electron microscope (TEM) to check whether the Cu-containing wiring line and the liner layer consisting of the Ru film were removed. As a result, it was found that both the Cu-containing wiring line and the liner layer consisting of the Ru film were suitably removed.

This result tells that the composition according to the embodiment of the present invention is suited for sequential and stepwise removal of two or more kinds of metal-containing substances (particularly a Cu-containing substance and a Ru-containing substance).

EXPLANATION OF REFERENCES

10a: wiring board not yet being subjected to recess etching treatment for wiring line
10b: wiring board having undergone recess etching treatment for wiring line
12: interlayer insulating film
14: barrier metal layer
16: metal-containing wiring line
18: recess portion
20, 30: object to be treated
22: substrate
24: metal-containing film
26: outer edge portion
32: substrate
34: metal-containing film
36: etching stop layer
38: interlayer insulating film
40: metal hard mask
42: hole
44: inner wall
44a: cross-sectional wall
44b: bottom wall
46: dry etching residue

What is claimed is:

1. A composition for removing metal-containing substances, comprising:
   one or more periodic acid compounds selected from the group consisting of a periodic acid and a salt thereof;
   an azole compound;
   an alkali compound; and
   a water-soluble organic solvent,
   wherein a molecular weight of the water-soluble organic solvent is equal to or less than 300, and
   wherein the composition has a pH of 7.0 to 14.0.

2. The composition according to claim 1,
   wherein the metal-containing substances include a ruthenium-containing sub stance.

3. The composition according to claim 1,
   wherein a ratio of a content of the periodic acid compounds to a content of the azole compound is 10 to 300 as a mass ratio.

4. The composition according to claim 1,
   wherein a ratio of a content of the periodic acid compounds to a content of the alkali compound is 0.5 to 2.0 as a mass ratio.

5. The composition according to claim 1,
   wherein the water-soluble organic solvent includes alkylene glycol dialkyl ether.

6. The composition according to claim 1,
   wherein a ratio of a content of the water-soluble organic solvent to a content of the azole compound is 10 to 2,000 as a mass ratio.

7. The composition according to claim 1,
   wherein the azole compound includes at least one compound selected from the group consisting of a triazole compound, a pyrazole compound, and an imidazole compound.

8. The composition according to claim 1,
   wherein the alkali compound includes at least one compound selected from the group consisting of quaternary ammonium hydroxide, aminoalcohol, ammonia, and potassium hydroxide.

9. The composition according to claim 1, further comprising:
   a surfactant.

10. The composition according to claim 1, further comprising:
    an organic acid.

11. The composition according to claim 10,
    wherein the organic acid includes at least one acid selected from the group consisting of a carboxylic acid and a phosphonic acid.

12. The composition according to claim 10,
    wherein the organic acid includes at least one carboxylic acid and at least one phosphonic acid.

13. A kit for preparing a composition used for removing metal-containing substances on a substrate, the kit comprising:
    a first liquid that contains one or more periodic acid compounds selected from the group consisting of a periodic acid and a salt thereof and an alkali compound; and
    a second liquid that contains an azole compound,
    wherein the first liquid or the second liquid contains a water-soluble organic solvent,
    wherein a molecular weight of the water-soluble organic solvent is equal to or less than 300, and
    wherein the composition has a pH of 7.0 to 14.0.

14. A method for treating a substrate, comprising:
    a step A of removing metal-containing substances on a substrate by using the composition according to claim 1.

15. The method for treating a substrate according to claim 14,
    wherein the metal-containing substances include a ruthenium-containing substance.

16. The method for treating a substrate according to claim 14,
    wherein there are two or more kinds of metal-containing substances on the substrate subjected to the step A.

17. The method for treating a substrate according to claim 16,
    wherein the two or more kinds of metal-containing substances include at least a ruthenium-containing substance and a copper-containing substance or a cobalt-containing substance.

18. The method for treating a substrate according to claim 14, wherein the metal-containing substances include a particle-like metal oxide.

19. The method for treating a substrate according to claim 14,
wherein the step A is a step A1 of performing a recess etching treatment on a metal-containing wiring line disposed on a substrate by using the composition, a step A2 of removing a metal-containing film at an outer edge portion of a substrate, on which the metal-containing film is disposed, by using the composition, a step A3 of removing metal-containing substances attached to a back surface of a substrate, on which a metal-containing film is disposed, by using the composition, a step A4 of removing metal-containing substances on a substrate, which has undergone dry etching, by using the composition, or a step A5 of removing metal-containing substances on a substrate, which has undergone a chemical mechanical polishing treatment, by using the composition.

20. The method for treating a substrate according to claim 19,
wherein the step A is the step A1,
there are two or more kinds of metal-containing substances on the substrate subjected to the step A1, and
a step A1a of removing at least one metal-containing substance among the two or more kinds of metal-containing substances and a step A1b of removing a metal-containing substance different from the metal-containing substance removed by the step A1a are performed as the step A1.

21. The method for treating a substrate according to claim 19 wherein the step A is the step A1, the method further comprising:
a step B of treating the substrate obtained by the step A1 by using a solution selected from the group consisting of a mixed solution of hydrofluoric acid and hydrogen peroxide water, a mixed solution of sulfuric acid and hydrogen peroxide water, a mixed solution of aqueous ammonia and hydrogen peroxide water, and a mixed solution of hydrochloric acid and hydrogen peroxide water, after the step A1.

* * * * *